United States Patent
Rodgers et al.

(10) Patent No.: US 6,507,138 B1
(45) Date of Patent: Jan. 14, 2003

(54) VERY COMPACT, HIGH-STABILITY ELECTROSTATIC ACTUATOR FEATURING CONTACT-FREE SELF-LIMITING DISPLACEMENT

(75) Inventors: M. Steven Rodgers, Albuquerque, NM (US); Samuel L. Miller, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/615,008

(22) Filed: Jul. 11, 2000

Related U.S. Application Data

(63) Continuation-in-part of application No. 09/340,994, filed on Jun. 24, 1999, now Pat. No. 6,133,670.

(51) Int. Cl.⁷ .................................. H02N 1/00
(52) U.S. Cl. ........................................ 310/309
(58) Field of Search ................. 310/308, 309, 310/40 MM, 313 B; 324/457; 322/2 A; 257/414; 318/116; 200/181

(56) References Cited

U.S. PATENT DOCUMENTS

| | | | |
|---|---|---|---|
| 5,015,906 A | * 5/1991 | Cho et al. | 310/309 |
| 5,025,346 A | 6/1991 | Tang | 361/283 |
| 5,353,641 A | 10/1994 | Tang | 73/517 R |
| 5,428,259 A | 6/1995 | Suzuki | 310/309 |
| 5,447,068 A | 9/1995 | Tang | 73/514.32 |
| 5,536,988 A | 7/1996 | Zhang | 310/309 |
| 5,541,465 A | * 7/1996 | Higuchi et al. | 310/309 |
| 5,554,304 A | 9/1996 | Suzuki | 216/2 |
| 5,620,931 A | 4/1997 | Tsang | 438/50 |
| 5,631,514 A | 5/1997 | Garcia | 310/309 |
| 5,640,039 A | 6/1997 | Chau | 257/417 |
| 5,770,913 A | 6/1998 | Mizzi | 310/328 |
| 5,804,084 A | 9/1998 | Nasby | 216/2 |
| 5,808,383 A | 9/1998 | Kostov | 310/12 |
| 5,834,864 A | 11/1998 | Hesterman | 310/40 MM |
| 5,847,280 A | 12/1998 | Sherman | 73/514.32 |
| 5,858,809 A | 1/1999 | Chau | 438/52 |
| 5,914,553 A | * 6/1999 | Adams et al. | 310/309 |
| 6,140,737 A | * 10/2000 | Boie | 310/309 |
| 6,175,443 B1 | * 1/2001 | Aksyuk et al. | 359/290 |
| 6,211,599 B1 | * 4/2001 | Barnes et al. | 310/307 |
| 6,288,829 B1 | * 9/2001 | Kimura | 359/209 |
| 6,411,589 B1 | * 6/2002 | Hoen et al. | 369/101 |

FOREIGN PATENT DOCUMENTS

| | | | | |
|---|---|---|---|---|
| JP | 02101972 A | * | 4/1990 | H02N/1/00 |
| JP | 08116683 A | * | 5/1996 | H02N/1/00 |
| JP | 09163761 A | * | 6/1997 | H02N/1/00 |
| WO | WO 200168512 A1 | * | 9/2001 | H02N/1/00 |

OTHER PUBLICATIONS

W.C. Tang.–C.H. Nguyen and R.T. Howe, "Laterally Driven Polysilicon Resonant Microstructures," *Sensors and Actuators*, vol. 20, pp. 25–32, 1989.

(List continued on next page.)

*Primary Examiner*—Nestor Ramirez
*Assistant Examiner*—Guillermo Perez
(74) *Attorney, Agent, or Firm*—John P. Hohimer

(57) ABSTRACT

A compact electrostatic actuator is disclosed for microelectromechanical (MEM) applications. The actuator utilizes stationary and moveable electrodes, with the stationary electrodes being formed on a substrate and the moveable electrodes being supported above the substrate on a frame. The frame provides a rigid structure which allows the electrostatic actuator to be operated at high voltages (up to 190 Volts) to provide a relatively large actuation force compared to conventional electrostatic comb actuators which are much larger in size. For operation at its maximum displacement, the electrostatic actuator is relatively insensitive to the exact value of the applied voltage and provides a self-limiting displacement.

47 Claims, 16 Drawing Sheets

OTHER PUBLICATIONS

W.C.–K. Tang, *Electrostatic Comb Drive for Resonant Sensor and Actuator Applications*, Ph.D. dissertation for University of California at Berkeley, 1990, available from University Microfilms.

T. Hirano, T. Furuhata, K.J. Gabriel and H. Fujita, "Design, Fabrication and Operation of Submicron Gap Comb–Drive Microactuators," *IEEE Journal of Microelectromechanical Systems*, vol. 1, pp. 52–59, Mar. 1992.

V.P. Jaecklin, C. Linder, N.F. de Rooij and J.–M. Moret, "Comb Actuators for XY–Microstages," *Sensors and Actuators A*, vol. 39, pp. 83–89, 1993.

R. Legtenberg, A.W. Groeneveld and M. Elwenspoek, "Comb–Drive Actuators for Large Displacements," *Journal of Micromechanics and Microengineering*, vol. 6, pp. 320–329, 1996.

M.S. Rodgers, S. Kota, J. Hetrick, Z. Li, B.D. Jensen, T.W. Krygowski, S.L. Miller, S.M. Barnes and M.S. Burg, "A New Class of High Force, Low–Voltage, Compliant Actuation Systems," *Technical Digest of the Solid–Stage Sensor and Actuator Workshop*, Hilton Head Island, SC, Jun. 4–8, 2000.

* cited by examiner

VERY COMPACT, HIGH-STABILITY ELECTROSTATIC ACTUATOR FEATURING CONTACT-FREE SELF-LIMITING DISPLACEMENT

CROSS REFERENCE TO RELATED APPLICATIONS

This is a continuation-in-part of application Ser. No. 09/340,994 filed Jun. 24, 1999 now U.S. Pat. No. 6,133,670.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to the field of microelectromechanical (MEM) systems, and in particular to a compact electrostatic actuator that can be formed by surface micromachining.

BACKGROUND OF THE INVENTION

Many different types of microelectromechanical (MEM) devices use one or more electrostatic actuators as motive sources. See, for example, U.S. Pat. No. 5,631,514 to Garcia et al which discloses a microengine that uses a pair of synchronized linear comb actuators as a power source. However, many problems exist with present electrostatic comb actuators which are generally considered to be low power, low output force devices.

Conventional comb actuators are disproportionate in size compared to other functional elements (e.g. gears, linkages, moveable assemblies, etc.) of MEM devices due to inefficient space utilization. Since a total substrate area (i.e. a die size) devoted to a particular MEM device is generally fixed by fabrication constraints, the disproportionate area required for one or more comb actuators limits the area available for use by the other functional elements of the MEM device. As a result, the complexity of a MEM device utilizing a conventional electrostatic comb actuator will ultimately be limited by the area required for each actuator.

Another problem with conventional electrostatic comb actuators is that these devices provide a relatively low drive force limited to a few tens of microNewtons ($\mu$N); and this level of drive force requires a relatively high operating voltage of up to 100 Volts or more. The relatively low drive force of conventional comb actuators limits their usefulness as power sources for many types of MEM devices.

Yet another problem with conventional electrostatic comb actuators is that a single-beam structure is commonly used; and this single-beam structure and one or more electrostatic combs supported thereon can easily be distorted due to slight asymmetries in a generated electrostatic field, or due to external loading. Such distortion can result in one or more fingers of an electrostatic comb bending or moving from a region of electrostatic stability to a region of electrostatic instability. This can result in binding of the comb actuator and limiting its range of motion. Permanent failure of the actuator can also occur as an electrical short circuit is developed between contacting fingers which are biased at different electrical potentials.

The compact electrostatic actuators of the present invention overcome many of the above limitations in the prior art.

An advantage of the present invention is that a compact design is provided for an electrostatic actuator to conserve space upon a substrate or portion thereof, thereby providing for more economical fabrication and allowing the fabrication of MEM devices of increased complexity. Embodiments of the electrostatic actuator of the present invention are provided as electrostatic comb actuators and as capacitively-coupled electrostatic plate actuators.

Another advantage of the electrostatic actuator of the present invention is that this actuator can provide an increased drive force as compared with a conventional comb actuator.

A further advantage of the present invention is that a comb actuator is provided with a more rigid structure that is less prone to distortion than a conventional electrostatic comb actuator, thereby increasing the reliability of the comb actuator even at high actuation voltages.

Still another advantage of the present invention is that an electrostatic actuator can be formed which provides a self-limiting displacement, thereby making the actuator relatively insensitive to the exact value of the applied voltage and acting to resist any further displacement due to an increase or decrease in loading.

Yet another advantage is that an electrostatic actuator according to the present invention can be provided with electrostatic shielding in critical places to minimize the effects of unwanted electrostatic fields, thereby increasing the available electrostatic drive power from the actuator and reducing any distortion of the structure of the actuator.

These and other advantages of the present invention will become evident to those skilled in the art.

SUMMARY OF THE INVENTION

The present invention relates to an electrostatic actuator formed on a substrate and comprising a plurality of capacitively-coupled electrostatic plates (also termed electrodes) including at least one row of fingerless stationary electrostatic plates formed on the substrate and oriented along a direction of movement of the electrostatic actuator, and a row of moveable electrostatic plates formed on at least one side of each row of the stationary electrostatic plates, with the moveable electrostatic plates being suspended above the substrate by a rigid frame which supports a majority of the moveable electrostatic plates at or near a midpoint thereof, the frame further surrounding and enclosing each row of the stationary electrostatic plates. In the electrostatic actuator, the frame is suspended above the substrate by a plurality of springs, with each spring being attached at one end thereof to the frame and attached at the other end thereof to the substrate. This allows the frame to be electrostatically moveable over a range of generally 0–10 microns in response to a voltage applied between the stationary electrostatic plates and the moveable electrostatic plates.

The frame can be formed from a plurality of layers (e.g. $\geq$3 layers) of a deposited and patterned electrically-conductive material (e.g. polycrystalline silicon when the substrate comprises silicon). Additionally, the frame comprises a plurality of links for supporting the majority of the moveable electrostatic plates at or near the midpoint thereof, with each link generally being formed from a smaller number of deposited and patterned layers than are used to form the remainder of the frame. A ground plane can be formed on the substrate below the frame at the location of each row of the moveable electrostatic plates; and an electrostatic shield can be provided between the frame and an adjacent stationary electrostatic plate.

The spacing between each moveable electrostatic plate and an adjacent stationary electrostatic plate can be made substantially the same for all of the stationary and moveable electrostatic plates. This allows the electrostatic actuator to be driven by a voltage that is simultaneously applied between all the stationary electrostatic plates and all the moveable electrostatic plates. Alternately, the stationary electrodes can be digitally addressed to provide the voltage between at least one set of the stationary electrostatic plates and the moveable electrostatic plates. In some preferred embodiments of the present invention, the spacing between adjacent moveable electrostatic plates in each row of the moveable electrostatic plates can be made substantially equal to the spacing between adjacent stationary electrostatic plates in each row of the stationary electrostatic plates.

The present invention further relates to an electrostatic actuator formed on a substrate and comprising a plurality of moveable electrodes suspended above the substrate and arranged in at least one row oriented along a direction of movement of the electrostatic actuator; a rigid frame surrounding and supporting the moveable electrodes; and a plurality of fingerless stationary electrodes formed on the substrate in a row proximate to the row of moveable electrodes, the rows of stationary and moveable electrodes acting in response to a voltage applied therebetween to urge the frame to move along the direction of movement.

The frame is suspended above the substrate by a plurality of springs, with each spring being attached at one end thereof to the frame and attached at the other end thereof to the substrate. All the electrodes of a given type (i.e. stationary or moveable) can be electrically connected together when forming a unidirectional device so that the actuator can be operated with a common voltage provided between the stationary electrodes and the moveable electrodes. Alternately, the stationary electrodes can be digitally addressed to provide the voltage between at least one set of the stationary electrostatic plates and the moveable electrostatic plates. With the spacing between each moveable electrode and a nearest stationary electrode being substantially equal for all of the stationary and moveable electrodes, an additive electrostatic force is generated to move the frame and thereby provide a displacement to a load.

The frame comprises a plurality of layers of a deposited and patterned electrically-conductive material (e.g. polycrystalline silicon when the substrate comprises silicon). The frame further includes a plurality of links for supporting a majority of the moveable electrodes at or near a midpoint thereof, with each link generally being formed from a smaller number of layers of the electrically-conductive material than are used to form the remainder of the frame to provide a large change in capacitance with displacement. A ground plane is generally formed on the substrate below each row of the moveable electrodes which is also generally maintained at ground electrical potential. An optional electrostatic shield can be provided on the substrate between the frame and one or more adjacent stationary electrodes.

The present invention also relates to an electrostatic actuator formed on a substrate and comprising a plurality of stationary electrodes formed on the substrate and regularly spaced in at least one row oriented along a direction of movement of the electrostatic actuator; a rigid frame supported above the substrate by a plurality of springs, with the frame surrounding each row of the stationary electrodes; and a plurality of moveable electrodes located on the frame on both sides of each row of the stationary electrodes, the moveable electrodes acting in combination with the stationary electrodes, which are either all connected together or configured as sets of electrodes, to displace the frame in the direction of movement in response to an applied voltage.

The moveable electrodes are supported on the frame in the electrostatic actuator by a plurality of links connecting the moveable electrodes and forming a plurality of rows of the moveable electrodes. Each link preferably has a thickness that is smaller than the thickness of the moveable electrodes (e.g. less than one-half the thickness of the moveable electrodes) to provide a large change in capacitance with displacement. The frame can comprise electrically-conductive polycrystalline silicon when the substrate comprises silicon. A ground plane is preferably formed on the substrate below the frame underneath the moveable electrodes; and an optional electrostatic shield can be formed on the substrate between the frame and an adjacent stationary electrode.

Additionally, the present invention relates to an electrostatic actuator which comprises a substrate (e.g. comprising silicon); a plurality of fingerless stationary electrodes formed on the substrate and arranged in at least one row oriented along a direction of movement of the electrostatic actuator; a plurality of moveable electrodes suspended above the substrate, with the number of moveable electrodes being at least equal to the number of stationary electrodes, and with at least one of the moveable electrodes acting in combination with each stationary electrode to generate an electrostatic force in response to a voltage applied therebetween to urge the moveable electrodes to move in the direction of movement; and a rigid frame surrounding and supporting the moveable electrodes above the substrate, with the frame being attached to the substrate by a plurality of springs.

The frame, the stationary electrodes and the moveable electrodes comprise a plurality of layers of a deposited and patterned electrically-conductive material (e.g. polycrystalline silicon). The frame further comprises a plurality of links for supporting a majority of the moveable electrodes, with each link being formed from at least one layer of the electrically-conductive material. A ground plane can be formed on the substrate below the moveable electrodes; and an electrostatic shield can be formed on the substrate between the frame and an adjacent stationary electrode.

The present invention further relates to an electrostatic actuator formed on a substrate (e.g. silicon) and comprising a plurality of fingerless stationary electrodes formed on the substrate from a plurality of layers (e.g. $\geq 3$ layers) of deposited and patterned electrically-conductive material (e.g. polycrystalline silicon); a plurality of moveable electrodes suspended above the substrate proximate to the stationary electrodes, with the moveable electrodes being formed from the plurality of layers of deposited and patterned electrically-conductive material; a plurality of links connecting the moveable electrodes, with the links being formed from the same number of layers or preferably fewer layers (e.g. a single layer) of the deposited and patterned electrically-conductive material than used to form the moveable electrodes; and a rigid frame surrounding and supporting the links and moveable electrodes, with the frame being formed from the plurality of layers of deposited and patterned electrically-conductive material and further being moveable in response to a voltage applied between the stationary and moveable electrodes.

The present invention also relates to an electrostatic actuator formed on a silicon substrate and comprising a plurality of stationary electrodes formed on the substrate from at least three layers of deposited and patterned polycrystalline silicon; a plurality of moveable electrodes suspended above the substrate proximate to the stationary electrodes, with the moveable electrodes being formed from at least three layers of deposited and patterned polycrystalline silicon; a plurality of links formed from at least one layer of deposited and patterned polycrystalline silicon, with each link connecting a pair of the moveable electrodes; and a frame formed from at least two layers of deposited and patterned polycrystalline silicon for supporting the links and moveable electrodes and further being moveable in response to a voltage applied between the stationary and moveable electrodes.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
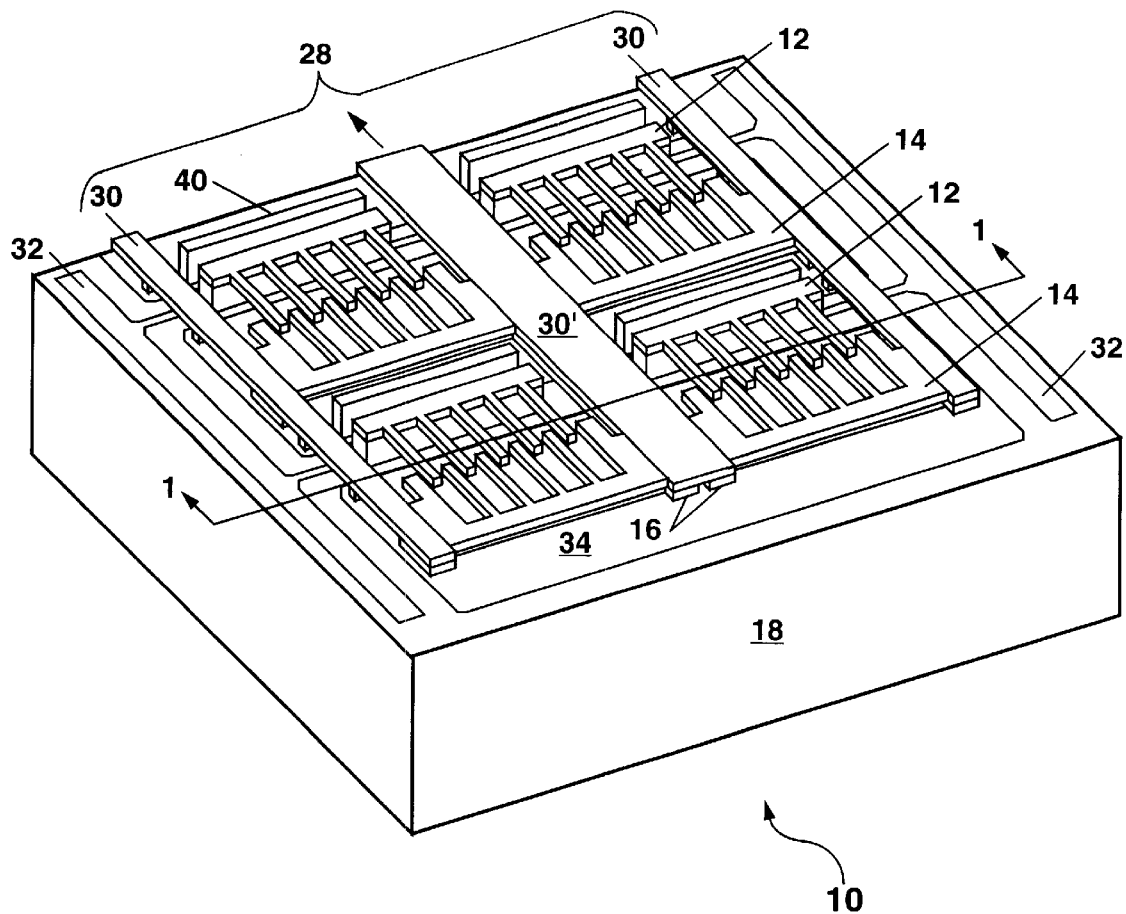
FIG. 1 shows a perspective view of a first embodiment of an electrostatic actuator according to the present invention.

Referring to FIG. 1, there is shown a schematic perspective view of a first embodiment of an electrostatic actuator 10 formed according to the present invention. The electrostatic actuator 10 in FIG. 1 comprises an electrostatic comb actuator with one or more stationary combs 12, and with each stationary comb 12 having a mating moveable comb 14. The electrostatic comb actuator 10 with a multi-layer structure can be formed on a substrate 18 by conventional surface micromachining processes as known to the art.

Figure 2:
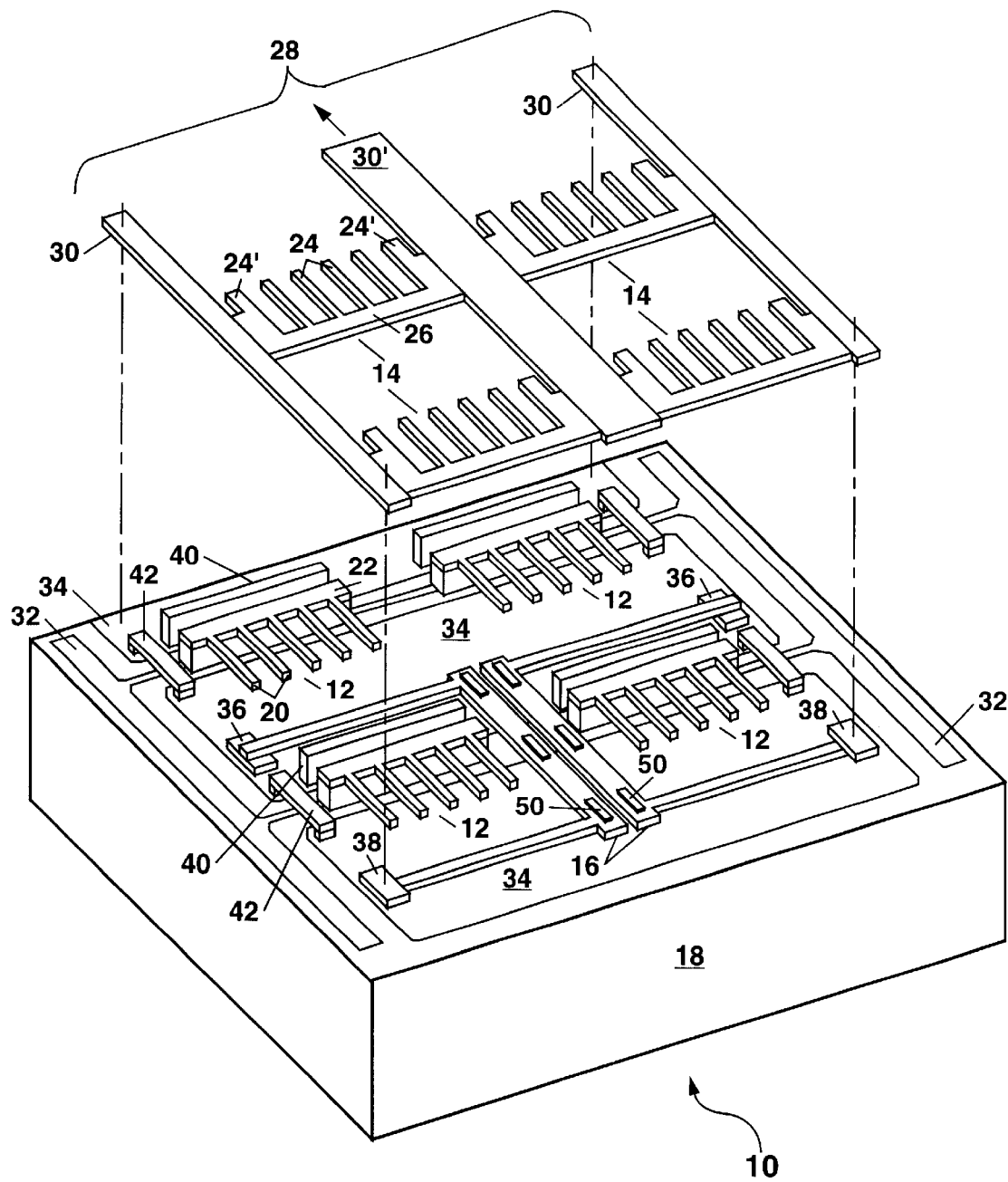
FIG. 2 shows a partially-exploded perspective view of the electrostatic actuator of FIG. 1 to show additional elements of the device including the restoring springs.

FIG. 2 shows a partially-exploded perspective view of the electrostatic comb actuator 10 of FIG. 1, with the moveable combs uplifted along the vertical projection lines to show a complementary pair of restoring springs 16 and other elements of the actuator 10. In FIG. 2, each stationary comb 12 comprises a plurality of stationary fingers 20 extending outward from a stationary cross-beam 22; and each moveable comb 14 comprises a plurality of moveable fingers 24 or 24' extending outward from a moveable cross-beam 26. In FIGS. 1–9, which show additional embodiments or details of electrostatic comb actuators 10 formed according to the present invention, the number of fingers 20 and 24 has been simplified for clarity. In an actual device 10, there will generally be about 2–4 times the number of fingers 20 and 24 as shown in FIGS. 1–9.

In a rest position with no applied voltage, the stationary fingers 20 of each stationary comb 12 are partially meshed (i.e. interdigitated to a predetermined extent of generally up to a few microns) with the moveable fingers 24 and 24' of a corresponding moveable comb 14 as shown in FIG. 1. Each stationary comb 12 is unmovable, being connected to the substrate 18 by one or more underlying layers that form supports for the stationary combs 12. On the other hand, each moveable comb 14 is attached to a framework or truss 28 (also termed hereinafter a "frame") that comprises a plurality of spaced, substantially parallel longitudinal beams 30 and 30' which are preferably aligned substantially parallel to the fingers 20 and 24 and are attached to the moveable combs 14 as shown in FIGS. 1 and 2.

The electrostatic comb actuator 10 is actuated by an electrical voltage, V, which is applied between the stationary and moveable combs 12 and 14 by an electrical distribution network 32 connected to the stationary comb 12, and by a ground plane 34 which underlies the moveable comb 14 and is electrically connected to the moveable comb 14 via an electrically-conducting restoring spring 16. Thus, the moveable comb 14 is typically maintained at ground electrical potential while the stationary electrode can have a variable electrical potential (e.g. from about 15–30 Volts up to about 90 Volts) applied to it via the electrical distribution network 32. The provision of the ground plane 34 underlying the moveable combs 14, restoring springs 16 and truss 28 minimizes a downward electrostatic force of attraction which otherwise might occur and tend to pull these members down towards the substrate 18.

In FIG. 2, the restoring spring 16 is suspended above the substrate 18 by one end of the spring 16 being physically connected to the substrate 18 through a lower attachment pad 36. The other end of the restoring spring 16 is physically connected to the moveable comb 14 through an upper attachment pad 38 which, in turn, is attached to either the moveable electrostatic comb 14 or the truss 28. Thus, the moveable combs 14 and supporting truss 28 are suspended above the substrate 18 by the restoring springs 16.

The size of the pads 36 and 38 can vary; and in some instances, the pads 36 and 38 can be formed integrally with the restoring spring 16. Thus, for example, the lower attachment pad 36 can be formed by forming a cut in an underlying layer of sacrificial material prior to depositing the polysilicon used to form the spring 16 so that the lower attachment pad 36 is formed integrally with the restoring spring 16. Similarly, the upper attachment pad 38 can be formed by patterning a layer of sacrificial material overlying the restoring spring 16 so that the same polysilicon used for an overlying longitudinal beam 30 can be deposited into a cut in the layer of sacrificial material to form the upper attachment pad 38.

In response to an applied voltage, V, between the stationary and moveable combs 12 and 14, an electrostatic force of attraction, $F_e$, can be generated to urge the moveable comb 14 towards the stationary comb 12, thereby providing a physical force to the truss 28 which can be coupled to drive a MEM device (i.e. a load) attached to the truss 28. A distance of movement, d, of the moveable comb 14 will depend upon several factors including the length of the intermeshed fingers 20 and 24 and a balancing of forces including the generated electrostatic force, $F_e$, which depends on the magnitude of the applied voltage, V, and a restoring force, $F_s$, provided by a lateral bending motion of the restoring springs 16. The distance of movement, d, will also depend upon whether the electrostatic combs 12 and 14 are arranged to act in a single direction of movement, or whether the combs 12 and 14 are arranged for bi-directional movement (i.e. a push-pull configuration). Upon removal of the applied voltage, V, the moveable combs 14 return to the rest position by action of the restoring springs 16. The electrostatic actuator 10 can be operated either with a static (direct current) voltage or with a cyclic (alternating current) voltage depending on whether the actuator 10 is to provide a sustained actuating force or a cyclic actuating force.

The electrostatic comb actuator 10 in FIGS. 1 and 2 provides a significant advance over the prior art in occupying only a fraction of the space required by conventional electrostatic comb actuators, while providing up to a hundred times higher drive force per unit area. Conventional electrostatic comb actuators are based on the use of relatively lengthy, compliant restoring springs which are located outside an outline of the electrostatic combs thereby consuming additional space beyond that required for the electrostatic combs. This results in a conventional comb actuator with 96 fingers occupying about 1000 µm×1200 µm of space on a substrate, with the area occupied by the electrostatic combs being only about one-quarter of that space.

Additionally, conventional comb actuators employ moveable electrostatic combs which are attached at only one end of the combs to a central beam, with the other end of the combs being unsupported (i.e. cantilevered). This results in a structure which is prone to a lateral bowing of the moveable combs due to a bending of the unsupported ends upon application of an actuation voltage. Such bowing, together with an unbalanced electrostatic force at the outside fingers, can result in the outside fingers of the stationary and moveable combs contacting each other and either binding motion of the actuator or resulting in an electrical short circuit between the stationary and moveable combs which typically operate at 80–100 Volts. Furthermore, conventional moveable electrostatic combs, being unsupported at one end, are free to bow downward towards a supporting substrate (e.g. due to static electrical charges on the combs and/or the substrate). This can lead to an adhesion (also referred to as stiction) of the moveable combs to the substrate, thereby preventing operation of the conventional electrostatic comb actuators. This affects the reliability and manufacturability of conventional electrostatic comb actuators.

The possibility of lateral bowing of the moveable combs in conventional comb actuators also places restrictions on the design of such actuators by limiting the number of fingers which can be used and a spacing between the fingers (generally 3 µm or more). The possibility of lateral bowing further limits a drive force that can be produced by conventional comb actuators to a few tens of microNewtons (µN), thereby limiting the types of MEM devices that can be formed based on actuation by the conventional comb actuators.

By fabricating the restoring spring 16 underlying or overlying the moveable combs 14 as shown in FIGS. 1 and 2, considerable space on the substrate 18 can be conserved thereby increasing the space available for other functional elements (e.g. gears or gear trains, linkages, moveable members, etc.) of a MEM device within a given die size. This also allows the fabrication of MEM devices of an increased complexity within the same die size, or allows a larger number of MEM devices to be fabricated on a substrate or wafer of a given size. Thus, by reducing the size of the electrostatic comb actuator, it becomes possible to fabricate MEM devices having a higher degree of complexity than would otherwise be feasible in view of practical considerations such as die size and packaging constraints. Furthermore, the formation of a smaller comb drive actuator 10 can reduce manufacturing costs for a particular MEM device and improve reliability.

Another feature of the electrostatic comb actuator 10 in FIGS. 1 and 2 is that the actuator 10 is formed with a rigid structure to substantially reduce any bowing of the combs, and also to reduce any distortion of the assembly of the moveable combs 14 and truss 28 during actuation or by an unbalanced electrostatic force across the actuator 10. With the moveable combs 14 encased within the truss 28, a rigid framework is formed so that the moveable combs 14 and the truss 28 move as a unit (i.e. forming a shuttle) to deliver the drive force (in an actuation direction indicated by the arrow in FIGS. 1 and 2) to a load. The strength provided by the truss 28 allows for a large number of fingers (e.g. 16 to 24 fingers) to be used on each comb, and for the fingers to be more closely spaced, thereby allowing the actuator 10 to provide an increased drive force in a smaller size.

To reduce the possibility of bowing of the individual fingers 20 and 24 on the electrostatic combs 12 and 14, the length of the fingers is made small (e.g. about 3–10 µm long) to provide a high stiffness (i.e. a low compliance) for the fingers 20 and 24. It should be noted that the compliance of the fingers 20 and 24 is proportional to the cube of the finger length and inversely proportional to the cube of the finger width. Thus, shorter fingers 20 and 24 can be made narrower while still being very stiff laterally to prevent any contact between adjacent fingers. Therefore reducing the length of the fingers 20 and 24 from 60 µm which is conventionally used to about 10 µm or less allows the fingers 20 and 24 to be made narrower (e.g. 1–2 µm) while at the same time permitting a closer spacing between the fingers so that a gap, g, between adjacent fingers 20 and 24 is reduced to about 1 µm or less. As a result, the actuator 10 can be made with a much larger total number of fingers 20 and 24 while occupying only a fraction of the space required by a conventional comb drive actuator. Furthermore, the drive force (defined herein as a net force which can be provided by the moveable electrostatic combs 14 and truss 28 to act upon a load connected to the electrostatic comb actuator 10) which can be produced by the electrostatic comb actuator 10 of the present invention can be much greater (up to one-hundred times the force per unit area) than the drive force available with conventional electrostatic comb actuators.

Figure 5:
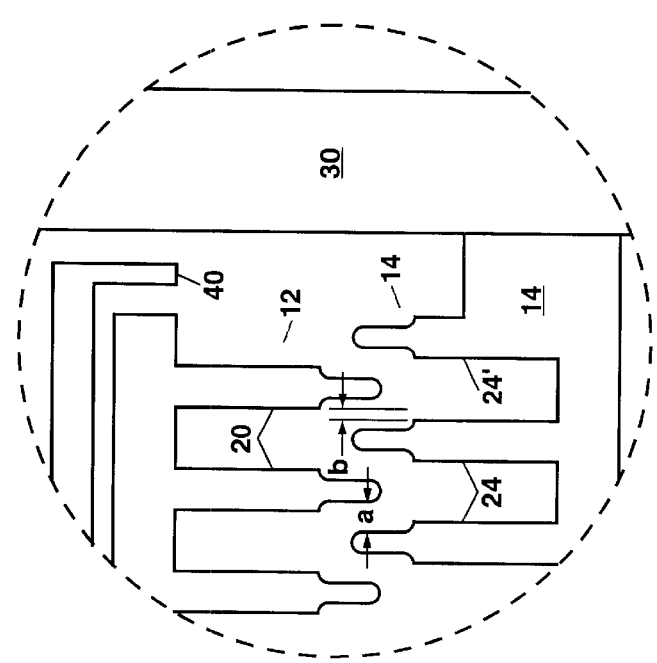
FIG. 5 shows an enlarged view of a portion of the electrostatic actuator of FIG. 4.

The electrostatic force, $F_e$, which can be electrically generated by an applied voltage, V, in the electrostatic comb actuator 10 when the fingers 20 and 24 are engaged is given by:

$$F_e = \frac{n\varepsilon t}{g}V^2$$

where n is a total number of active fingers (defined herein as the number of fingers on one type of the stationary or moveable electrostatic combs that are surrounded by fingers on the other comb to produce a balanced electrostatic force, with n generally being equal to the total number of fingers on the stationary electrostatic combs 12), $\varepsilon$ is the permittivity of a medium (e.g. a liquid or gas) in which the actuator 10 operates, t is a vertical height of the fingers 20 and 24, and g is a gap between adjacent fingers 20 and 24 (e.g. gap "a" or "b" in FIG. 5).

The above equation shows that the generated electrostatic force, $F_e$, at a given value of the applied voltage, V, can be increased either by increasing the number of fingers, n, by increasing the vertical height, t, of the fingers, by decreasing the gap, g, or by a combination thereof. However, any substantial increase in the electrostatic force, $F_e$, can only be achieved if the moveable combs 14 are rigidly supported to prevent bending of the combs 14. Such rigid support is provided by the truss 28 in FIGS. 1 and 2.

Another consideration to be taken into account is bending of the outside fingers 24' caused by an unbalanced electrostatic force at the ends of the electrostatic combs 12 and 14. To prevent such bending, the outside fingers 24' in the actuator 10 can be stiffened by increasing their width and also by increasing contact of these outside fingers 24' with the longitudinal beams 30 and 30' of the truss 28 as shown in FIG. 2.

To further balance the electrostatic force that acts upon the moveable combs 14, one or more electrostatic shields can be provided proximate to each stationary comb 12. Such electrostatic shields can include a horizontal electrostatic shield 40 located adjacent and parallel to the stationary cross-beam 22 of the stationary comb 12, and a vertical electrostatic shield 42 located at one end of the stationary cross-beam 22 and bridging over a portion of the electrical distribution network 32 as shown in FIG. 2. Each of the electrostatic shields 40 and 42 is electrically conductive and is connected to the ground plane 34 so that the shields 40 and 42 are maintained at ground electrical potential (i.e. at the same electrical potential as the moveable combs 14 and the truss 28).

The horizontal electrostatic shield 40 can be positioned to reduce an electrostatic force of attraction between a stationary electrostatic comb 12 of a first pair of electrostatic combs (e.g. at the lower left of FIG. 1) and a moveable electrostatic comb 14 of a second pair of electrostatic combs (e.g. at the upper left of FIG. 1) which is oppositely directed from the electrostatic force of attraction between each pair of meshed combs 12 and 14. Similarly, the horizontal electrostatic shield 40 reduces an oppositely-directed electrostatic force of attraction between each stationary electrostatic comb 12 and an adjacent restoring spring 16 which is connected to a moveable electrostatic comb 14. Finally, the horizontal electrostatic shield 40 can reduce an electrostatic force of attraction between the stationary electrostatic comb 12 and the longitudinal beams 30 and 30' of the truss 28 in a direction at right angles to the actuation direction (the actuation direction is indicated by the arrow in FIGS. 1 and 2) which could possibly distort the truss 28 or short out the fingers 20 and 24. The provision of the horizontal electrostatic shield 40 can thus minimize or eliminate unwanted electrostatic forces which act counter to the actuation direction and thereby increase the net force which can be produced by the electrostatic comb actuator 10.

Each vertical electrostatic shield 42 underlies an outer longitudinal beam 30 in order to reduce a downward electrostatic force of attraction between that beam 30 and the electrical distribution network 32. The vertical electrostatic shields 42 together with the ground planes 34 substantially reduce any downward electrostatic force upon the moveable electrostatic combs 14 and the truss 28.

Each element or member of the electrostatic comb actuator 10 in FIGS. 1 and 2 has generally been designed to increase the electrostatic force of attraction which contributes to the drive force in the actuation direction and to reduce any oppositely-directed forces. As a result, it is expected that the electrostatic comb actuator 10 of the present invention will be capable of providing a drive force that is up to one hundred times larger per unit area than the force provided by a conventional comb drive actuator. Furthermore, the electrostatic comb actuator 10 of the present invention can be made more rigid and therefore less susceptible to distortion and stiction than conventional electrostatic comb actuators.

The electrostatic actuator 10 of FIGS. 1 and 2 can be formed by surface micromachining processes as described hereinafter with reference to FIGS. 3a–3k which show schematic cross-sections of the actuator 10 along the section lines 1—1 of FIG. 1. The surface micromachining processes are based on conventional IC processing steps, including material deposition, photolithography, masking, etching, mask stripping, and cleaning. Up to hundreds of individual process steps can be used to form the completed structure of the electrostatic actuator 10 based on repeated deposition and patterning of alternating layers of polycrystalline silicon (also termed polysilicon) and a sacrificial material (e.g. silicon dioxide or a silicate glass), with the actuator being built up layer by layer. In a preferred process for forming the electrostatic actuator 10 of FIGS. 1 and 2, altogether five layers or levels of polysilicon are used as described hereinafter. The term "patterning" as used herein refers to a sequence of well-known processing steps including applying a photoresist to the substrate 18, prebaking the photoresist, aligning the substrate 18 with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by etching.

Figure 3A:
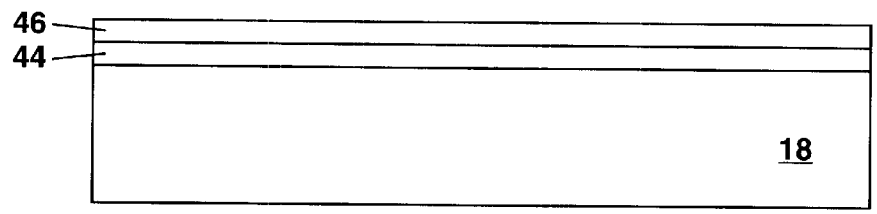
FIGS. 3a–3k schematically illustrate formation of the electrostatic actuator of FIGS. 1 and 2 by surface micromachining.

In FIG. 3a, a substrate 18 is provided which preferably comprises silicon, and can be either a monocrystalline silicon substrate or a silicon-on-insulator substrate. The substrate 18 can be initially prepared for fabrication of the actuator 10 as shown in FIG. 3a by blanketing the substrate with a layer of thermal oxide 44 (about 600 nanometers thick) formed by a conventional wet oxidation process at an elevated temperature (e.g. 1050° C. for about 1.5 hours). A layer of low-stress silicon nitride 46 (e.g. 800 nanometers thick) can then be deposited over the thermal oxide layer using low-pressure chemical vapor deposition (LPCVD) at about 850° C. The thermal oxide and silicon nitride layers 44 and 46 (which have been omitted from FIGS. 1 and 2) provide electrical isolation from the substrate 18 for a subsequently-deposited first polysilicon layer (termed Poly-0). One or more vias can be photolithographically defined and etched through the thermal oxide and silicon nitride layers so that electrical connections between the Poly-0 layer and the substrate 18 can be formed.

Figure 3B:
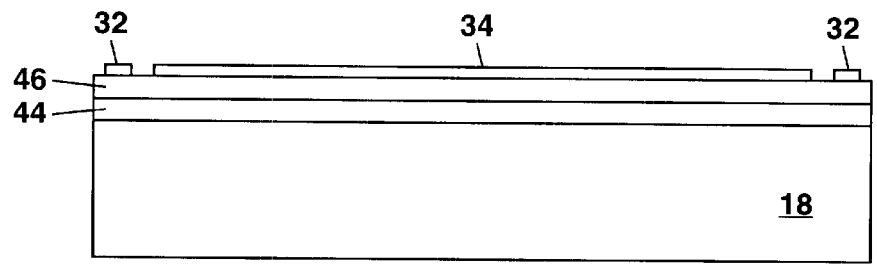

The Poly-0 layer, which can be about 300 nanometers thick, is deposited by LPCVD at about 580° C. to blanket the substrate 18 and the thermal oxide and silicon nitride layers. Phosphorous doping can be used to make the Poly-0 layer and other polysilicon layers electrically conductive. The Poly-0 layer can then be patterned as shown in FIG. 3b by photolithographic definition and etching to form the ground planes 34 and the electrical distribution network 32. After deposition and patterning, the Poly-0 layer can be annealed at a high temperature (e.g. at about 1100° C. for three hours) to remove any stress therein. A separate annealing step can be performed after deposition and patterning of each subsequent polysilicon layer.

Figure 3C:
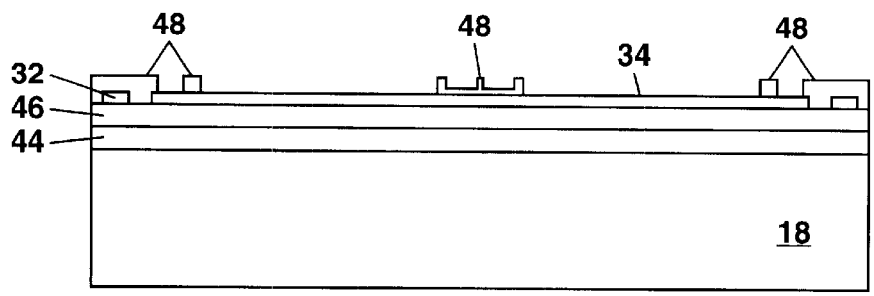

A first layer of sacrificial material 48 about 2-$\mu$m thick can be blanket deposited to cover the Poly-0 layer and the substrate 18 and patterned as shown in FIG. 3c. The first layer of sacrificial material 48 can comprise silicon dioxide (SiO$_2$) or a silicate glass (e.g. a plasma-enhanced CVD oxide, also termed PECVD oxide; or a silicate glass deposited from the decomposition of tetraethylortho silicate, also termed TEOS, by LPCVD at about 750° C. and densified by a high temperature processing).

After deposition, each layer of the sacrificial material 48 described herein can be preferably planarized by chemical-mechanical polishing (CMP) as described in U.S. Pat. No. 5,804,084 to Nasby et al, which is incorporated herein by reference. The use of CMP permits the layer thickness of each layer of the sacrificial material 48 to be precisely adjusted, maintains a planar topography during build up of the structure of the electrostatic comb actuator 10, and eliminates any stringers which might otherwise occur as a result of anisotropic etching (e.g. reactive ion etching) which could otherwise result in mechanical interferences during motion of members formed in adjacent polysilicon layers. After the optional CMP step, a plurality of openings can be photolithographically defined and etched (e.g. by reactive ion etching) through the first layer of sacrificial material 48 to the underlying Poly-0 layer at the locations of the lower attachment pads 36 for the restoring springs 16, at the locations of supports for the stationary combs 12, and at locations wherein the horizontal and vertical electrostatic shields 40 and 42 are to be electrically connected to the ground planes 34.

Figure 3D:
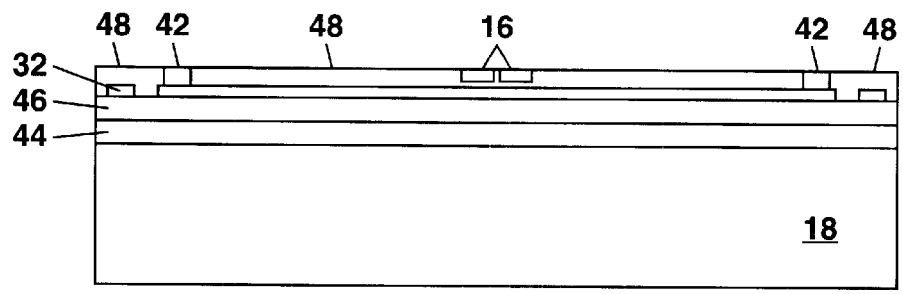

A second layer of polysilicon (termed herein as Poly-1) about 1-$\mu$m thick can be blanket deposited over the first sacrificial layer to fill each opening therein and begin to build up the vertical electrostatic shields 42 and to the restoring springs 16 as shown in FIG. 3d. Additionally, the Poly-1 layer can be used to form the lower attachment pads 36, and to build up the horizontal electrostatic shields 40 and supports for the stationary electrostatic combs 12 (not shown in FIG. 3d). Furthermore, the Poly-1 layer, in some preferred embodiments of the present invention, can be used to begin to build up the longitudinal beams 30 and 30' in regions not occupied by the restoring springs 16. Finally, in some preferred embodiments of the invention which employ multi-layer fingers 20 and 24 for the electrostatic combs 12 and 14 in regions where there are no underlying restoring springs 16, the Poly-1 layer can be used to build up such multi-layer fingers.

The Poly-1 layer and all subsequently-deposited polysilicon layers can be deposited by LPCVD at about 580° C. Any of the Poly-1 layer that is not used to form elements of the electrostatic comb actuator 10 can be removed either by CMP, or by masking elements of the actuator 10 and etching away the remaining polysilicon with either a selective wet etchant or with anisotropic dry etching (e.g. reactive ion etching).

Figure 3E:
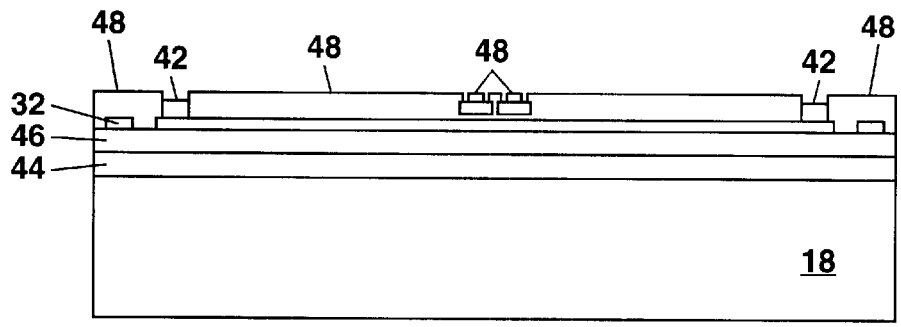

A second layer of the sacrificial material 48, preferably having the same composition as the first layer of sacrificial material and about 0.5 $\mu$m thick, can then be blanket deposited over the Poly-1 layer and patterned by etching to form a plurality of openings at the locations of the various elements being built-up from polysilicon as shown in FIG. 3e. The second layer of sacrificial material 48 can also be patterned to leave isolated regions of the sacrificial material 48 overlying the Poly-1 layer in a portion of each restoring spring 16 which will eventually underlie a central longitudinal beam 30'. In this way, a third layer of polysilicon (termed herein as Poly-2) can be used to encapsulate the isolated regions of sacrificial material thereby forming upward-extending dimples 50 for minimizing contact between the restoring spring 16 and the overlying central longitudinal beam 30' to reduce the possibility of friction during movement of the moveable combs 14 and truss 28 upon actuation. Such dimples 50 are shown in FIGS. 2 and 3f.

Figure 3F:
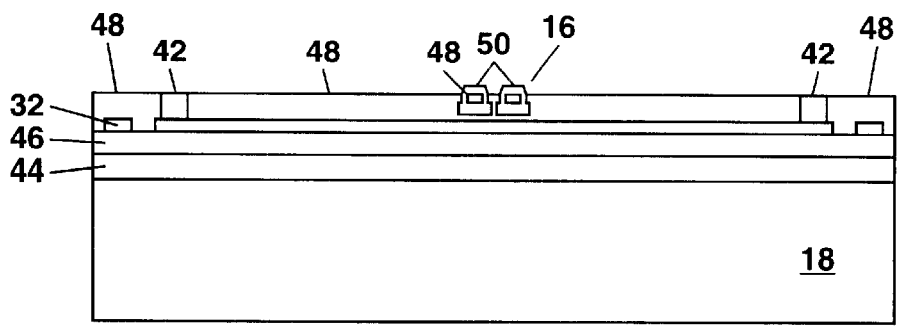

In FIG. 3f, the Poly-2 layer can be blanket deposited over the substrate 18 and patterned to complete formation of the restoring springs 16 with included dimples 50, and to build up the vertical electrostatic shields 42. The Poly-2 layer can also be used to build up the horizontal electrostatic shields 40 and the supports for the stationary combs 12 (not shown in FIG. 3f). Optionally, the Poly-2 layer can be used to build up multi-layer fingers 20 and 24 and the longitudinal beams 30 and 30' in regions not occupied by the restoring springs 16. The Poly-2 layer can be, for example, 2-$\mu$m thick. A remaining portion of the Poly-2 layer that is not used for forming elements of the electrostatic comb actuator 10 can be removed as described previously by using either CMP or masking and etching.

Figure 6:
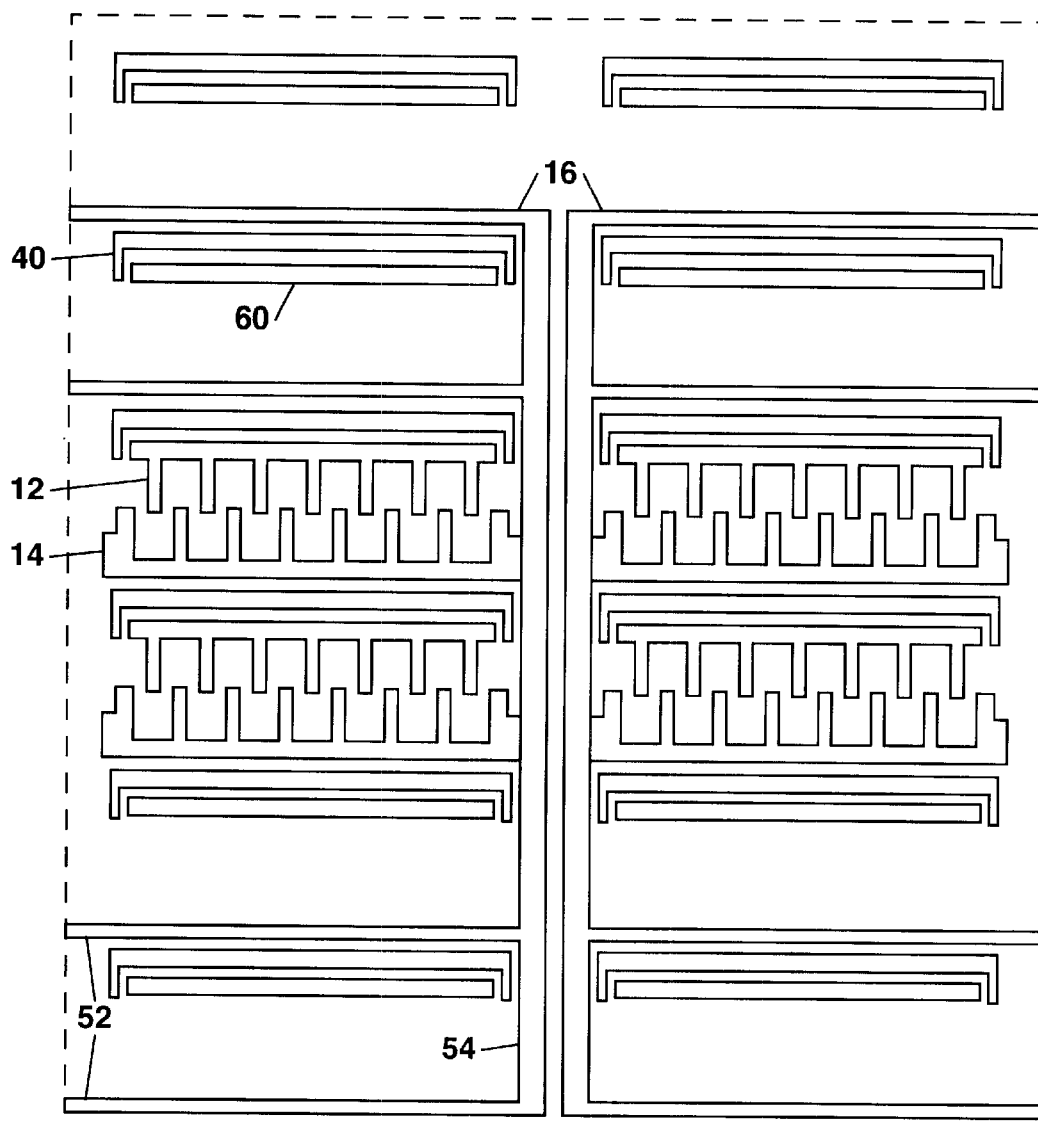
FIG. 6 shows in plan view the Poly-2 layer which can be used for simultaneously forming a plurality of restoring springs, and also for forming electrostatic combs in regions not occupied by the restoring springs.

The restoring springs 16 formed from the Poly-1 and Poly-2 layers can have a folded configuration as shown in FIGS. 2 and 6, with one or more pairs of spaced spring members 52 being connected to an arm 54 which underlies the central longitudinal beam 30'. Each of the spring members 52 can be, for example, 2 $\mu$m wide×2.5 $\mu$m high×100 $\mu$m long and connected to a 5-$\mu$m-wide arm 54 which underlies the central longitudinal beam 30'. The length of the 5-$\mu$m-wide spring arm will depend on a total number of pairs of electrostatic combs 12 and 14 for the actuator 10, and whether the arm is used to interconnect one or more pairs of spaced spring members as shown in FIG. 6. In some embodiments of the present invention, a pair of restoring springs 16 such as those shown in FIG. 6 can have arms 54 which are connected together.

The restoring springs 16 in FIGS. 2 and 6 are only about one-fifth as long as the outside springs used in a conventional electrostatic comb actuator. This results in the restoring springs 16 in FIGS. 2 and 6 being much stiffer (i.e. lower compliance) than conventional springs. This is advantageous for reducing the possibility of adhesion (i.e. stiction) of the restoring springs 16 to the substrate 18 during an etch release step; and also to reduce the possibility for motion of the moveable electrostatic combs 14 and the truss 28 in directions other than the actuation direction. Additionally, the provision of stiffer restoring springs 16 according to the present invention may eliminate the need for guides which are required in conventional electrostatic comb actuators to limit motion to the actuation direction.

Other configurations for the restoring springs 16 are possible according to the present invention. For example, in some cases restoring springs 16 can be formed both above and below the moveable electrostatic combs 14. Also, the complementary pair of restoring springs 16 shown in FIGS. 2 and 6 can be interconnected to provide an increased stiffness. Furthermore, the folded springs 16 of FIGS. 2 and 6 can be replaced by a plurality of straight restoring springs 16, with the straight springs being connected at one end thereof to the substrate 18, and at the other end to the moveable electrostatic combs 14 or to one of the longitudinal beams 30 or 30'. In some embodiments of the present invention, the restoring springs 16 are formed within the outline of the electrostatic combs 12 and 14 (indicated by the dashed lines in FIG. 6) to conserve space; whereas in other embodiments of the present invention, the restoring springs 16 can be formed outside the truss 28 as shown, for example, in FIG. 10.

Figure 3G:
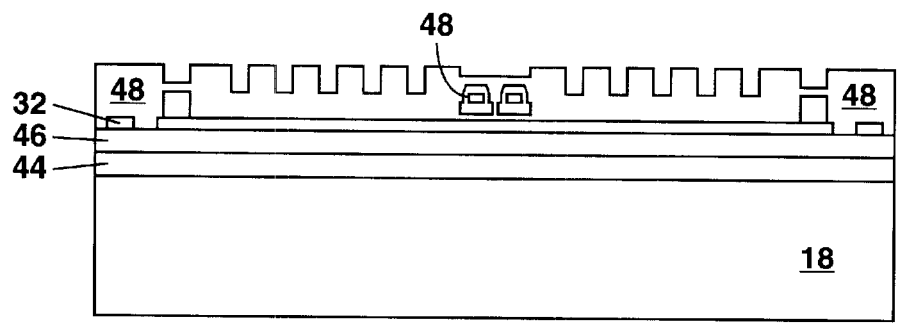
Figure 3H:
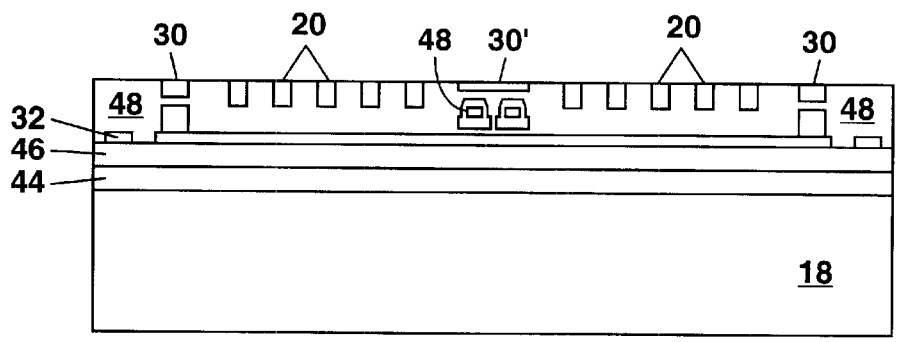

In FIG. 3g, a third layer of the sacrificial material 48 can be deposited over the substrate 18 and patterned to form openings at the locations of the various elements being built up to form the electrostatic comb actuator 10 (i.e. the support for each stationary comb 12 and the horizontal and vertical electrostatic shields 40 and 42). Additionally, openings can be formed at the locations of a plurality of upper attachment pads 38 for connecting the restoring springs 16 to the moveable electrostatic combs 14 or to the truss 28. In some embodiments of the present invention, the upper attachment pads 38 can be omitted and each restoring spring 16 can be directly connected to an outer longitudinal beam 30. This can be done by forming the outer longitudinal beams 30 from multiple layers of polysilicon (e.g. a Poly-3 layer and a Poly-4 layer as described hereinafter). FIGS. 3g and 3h show this variation of the present invention, with the third layer of sacrificial material 48 being patterned to provide openings wherein a fourth layer of polysilicon (termed herein as Poly-3) is deposited to begin to build up a multi-layer truss 28.

In FIG. 3h, a fourth polysilicon layer (termed herein as Poly-3) can be deposited over the substrate and patterned to begin to build up a multi-layer truss 28 (i.e. longitudinal beams 30 and 30') and to build up the plurality of multi-layer fingers 20. Additionally, although not shown in FIG. 3h, the Poly-3 layer is also used to build up the supports for the stationary combs 12, the horizontal electrostatic shields 40, the upper attachment pads 38 and the moveable fingers 24 and 24'. The Poly-3 layer can be, for example, 2.25 µm thick. A remaining portion of the Poly-3 layer not used for forming elements of the electrostatic comb actuator 10 can be removed as described previously for the Poly-1 and Poly-2 layers.

Figure 3I:
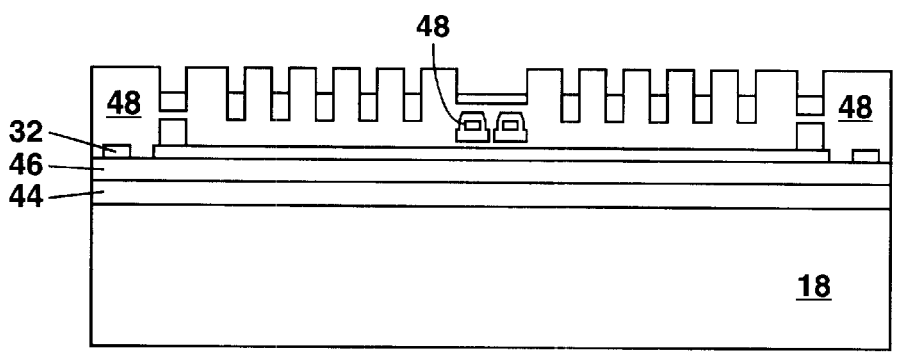

In FIG. 3i, a fourth layer of the sacrificial material 48 can be blanket deposited to cover the substrate 18 and patterned to define a plurality of shaped openings for a subsequent deposition of polysilicon to further build up the stationary and moveable electrostatic combs 12 and 14 with their interdigitated fingers 20 and 24, and also to build up the longitudinal beams 30 and 30' of the truss 28.

Figure 3J:
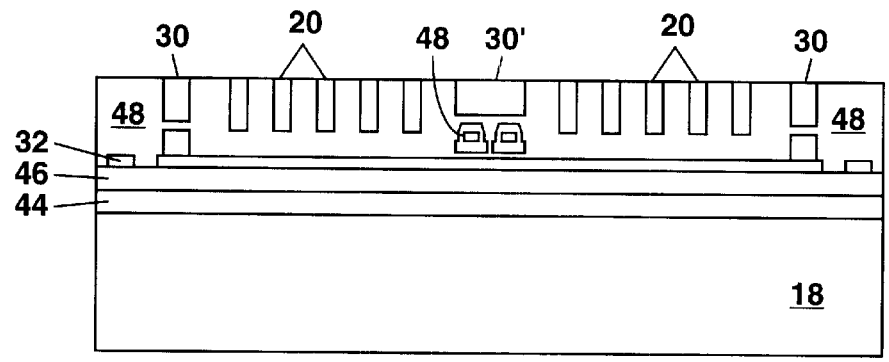

In FIG. 3j, a fifth polysilicon layer (termed herein as Poly-4) can be deposited to blanket the substrate and fills in the openings in the fourth sacrificial layer to further build up and form the stationary electrostatic combs 12, the moveable electrostatic combs 14 and the truss 28. The Poly-4 layer can be, for example, 2.25 µm thick. The thickness, t, of the fingers 20 and 24 and 24' can be about 2–7 µm depending on how many of the Poly-1 through Poly-4 layers are used to build up the fingers. Any of the Poly-4 layer that extends upward beyond the fourth sacrificial layer can be removed either by CMP, or by protecting the combs 12 and 14 and the truss 28 with a patterned masking layer and then etching away an unmasked portion of the Poly-4 layer.

In FIG. 3j, the completed central longitudinal beam 30' can be, for example, 12 µm wide and each of the outer longitudinal beams 30 can be 5 µm wide. The length of the longitudinal beams 30 and 30' will depend upon the number of moveable electrostatic combs 14 to be formed for the actuator 10, the size of each comb 14 and a spacing between adjacent of the combs 14.

Figure 3K:
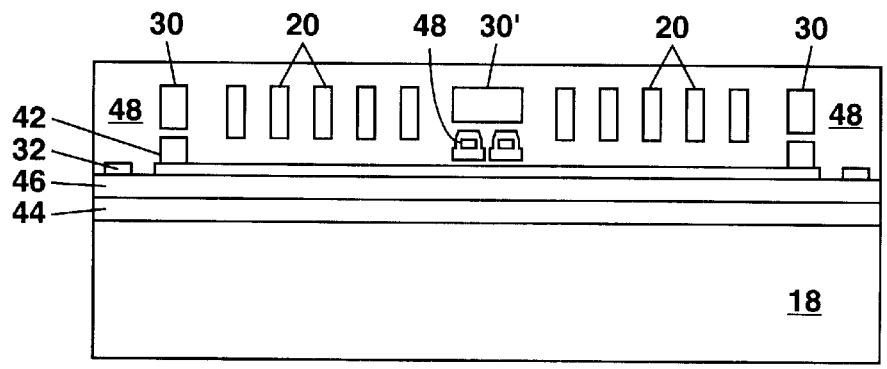

In FIG. 3k, a fifth sacrificial layer can be deposited over the substrate 18 to encapsulate the electrostatic comb actuator 10. A final high-temperature annealing step can be performed to relieve any stress in the various polysilicon layers so that the elements of the actuator 10 will be substantially planar and will not curl upon release.

The electrostatic comb actuator 10 can be released for operation by selectively etching away the various sacrificial layers using a selective etchant comprising hydrofluoric acid (HF) that does not chemically attack the polysilicon layers. For this purpose, a plurality of access holes (not shown) can be formed through each of the polysilicon layers as needed to expose underlying portions of the sacrificial layers. The completed actuator 10 after removal of the sacrificial layers is shown in FIG. 1. Although not shown in FIG. 1, each longitudinal beam 30 and 30' can be connected to a bridge 56 (see FIG. 4) for increased rigidity of the truss 28 and to provide a single point for connection of a load to the actuator 10, thereby concentrating the electrostatic drive force generated by the actuator 10.

In an alternative fabrication process, the various structural polysilicon layers (i.e. Poly-1 through Poly-4) can be blanket deposited and patterned, and then an overlying layer of the sacrificial material 48 can be deposited over each polysilicon layer and planarized by CMP.

Although the method described above for fabricating the electrostatic comb actuator 10 is based on forming the restoring springs 16 superposed below the moveable electrostatic combs 14, those skilled in the art will understand that the arrangement of the individual elements forming the actuator 10 can be varied so that, in some instances, the restoring springs 16 can overlie the moveable electrostatic combs 14. This could be done, for example, by attaching one end of each spring to the substrate 18 via a built-up post located outside the truss 28, or via a built-up post located inside the truss 28 near the horizontal electrostatic shield 40, or even via the horizontal shield 40 itself which can be built-up above the electrostatic combs 12 and 14. The other end of each spring 16 can be connected to one of the moveable electrostatic combs 14 via one of the outer longitudinal beams 30 or via an upper attachment pad 38.

Figure 4:
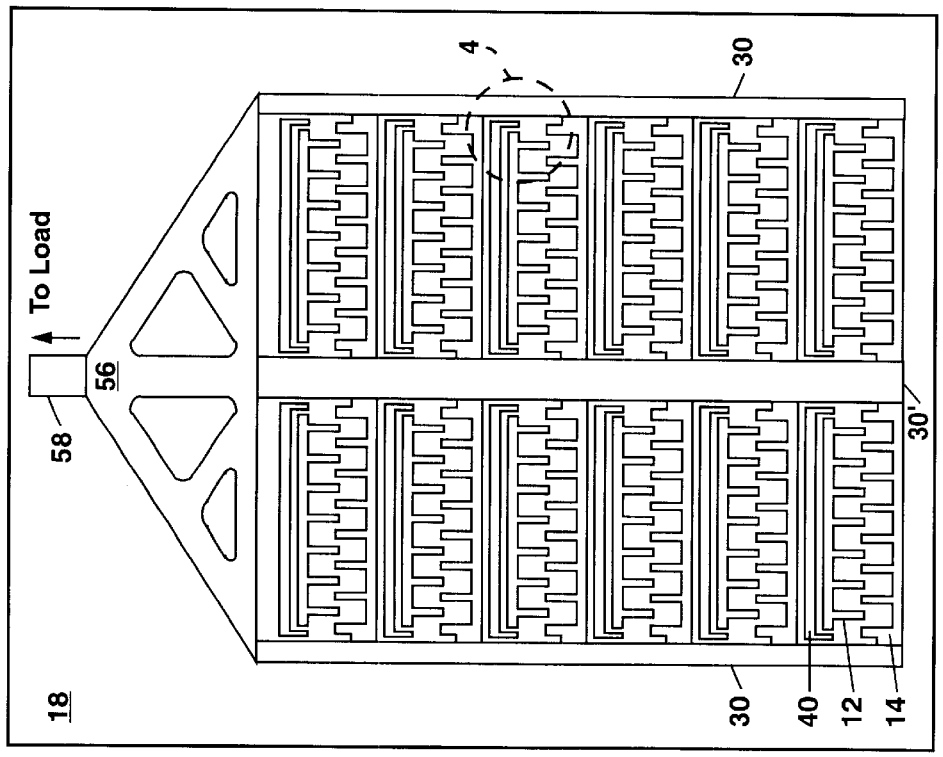
FIG. 4 shows a plan view of a second embodiment of an electrostatic actuator according to the present invention.

FIG. 4 shows a plan view of a second embodiment of the electrostatic actuator 10 according to the present invention. The second embodiment of the actuator 10 comprises a plurality of pairs of electrostatic combs formed on a substrate 18 and having interdigitated fingers, with each pair of electrostatic combs including a stationary electrostatic comb 12 and a moveable electrostatic comb 14. The actuator 10 further comprises a truss 28 which comprises a plurality of spaced, substantially parallel beams 30 and 30' for supporting and interconnecting the moveable electrostatic combs 14; and a bridge 56 attached to one end of the beams 30 and 30' to concentrate an electrostatic drive force generated within the actuator 10. One or more restoring springs 16 can be provided superposed below or above the moveable electrostatic combs 14 to restore the combs 14 to a rest position in the absence of any applied voltage. The second embodiment of the present invention can be formed as a MEM device using surface micromachining processes as previously described with reference to FIGS. 3a–3k.

To provide a high drive force for the actuator 10, the fingers 20, 24 and 24' can be formed with a tapered shape as shown in the enlarged view in FIG. 5. An unattached end of each finger 20, 24 and 24' in FIG. 5 is necked down to provide a spacing with a dimension "a" of the partially enmeshed (i.e. engaged) fingers that is about equal to a minimum feature size which can be photolithographically defined. This minimum feature size can be, for example, 1 $\mu$m when using a projection stepper for photolithographic definition of the various elements of the actuator 10. However, the remainder of each finger 20, 24 and 24' can be wider than the necked end so that when the fingers are further engaged together the spacing can be reduced to a dimension "b" which is less than the minimum feature size (e.g. less than 1 $\mu$m). By reducing the dimension "b" to less than the minimum feature size that can be photolithographically defined, a two-fold advantage is realized. First, the electrostatic force of attraction, $F_e$, can be increased since the gap, g, between adjacent fully-engaged fingers is reduced from "a" to "b", and $F_e$ varies inversely as the gap, g. Second, reducing the dimension "b" to less than the minimum feature size allows the spacing between the fingers on each electrostatic comb 12 and 14 to be reduced, thereby allowing more fingers to be fabricated per unit area within the combs 12 and 14 which directly increases the electrostatic force, $F_e$. As a result, a much larger electrostatic force of attraction, $F_e$, can be produced with the design of FIGS. 4 and 5 than would otherwise be possible with fingers of a uniform width. The electrostatic comb actuator 10 of FIG. 4 can be formed with up to 600–1500 active fingers. As an example, an actuator 10 with 1120 active fingers can be fabricated in an outline for the moveable combs 14 and truss 28 of 420 $\mu$m×240 $\mu$m, with the fingers 20 and 24 each being 1.5 $\mu$m wide and spaced apart by 1.5 $\mu$m.

FIGS. 4 and 5 also show an alternate design for the horizontal electrostatic shields 40 which are angled around either end of the stationary electrostatic combs 12 to further reduce an unwanted electrostatic force of attraction between the stationary combs 12 and the longitudinal beams 30 and 30' of the truss 28. This helps to prevent any sideways motion of the truss 28 and the moveable combs 14 which might otherwise occur due to unbalanced electrostatic forces. To provide a symmetrical electrostatic loading for the outside fingers 24', the horizontal electrostatic shields 40 should preferably not extend beyond the cross-beams of the stationary electrostatic combs 12. The second embodiment of the present invention can further include vertical electrostatic shields 42 underlying the outside longitudinal beams 30 as described previously.

In FIG. 4, the bridge 56 can be formed as shown from a plurality of interconnected beams to provide a high strength-to-mass ratio. Additionally, the bridge 56 can be formed from multiple stacked and interconnected layers of polysilicon (e.g. Poly-3 and Poly-4). The triangular structure of the bridge 56 is designed to concentrate the drive force produced by the actuator 10 at a single point for coupling to a load via a single linkage arm 58.

To increase the drive force, a plurality of layers of polysilicon forming the electrostatic combs 12 and 14 can be stacked and interconnected to increase a thickness, t, of the interdigitated fingers 20 and 24. In polysilicon layers used to form the restoring springs 16, the electrostatic combs 12 and 14 can be built-up from these same polysilicon layers in regions of the layers not used for forming the springs 16. One such polysilicon layer (e.g. the Poly-2 layer) used for both forming the restoring springs 16 and building up the electrostatic combs 12 and 14 is schematically illustrated in plan view in FIG. 6, with a dashed outline indicating a region of the substrate reserved for the truss 28 and electrostatic combs 12 and 14. As shown in FIG. 6, the Poly-2 layer can be used to build up supports 60 for the stationary electrostatic combs 12, to build up each horizontal electrostatic shield 40 (and optionally to build up a plurality of vertical electrostatic shields which are not shown in FIG. 6), to form the spring members and arms of the restoring springs 16, and to form one layer of multi-layer electrostatic combs 12 and 14 in regions not occupied by the springs 16.

Figure 7:
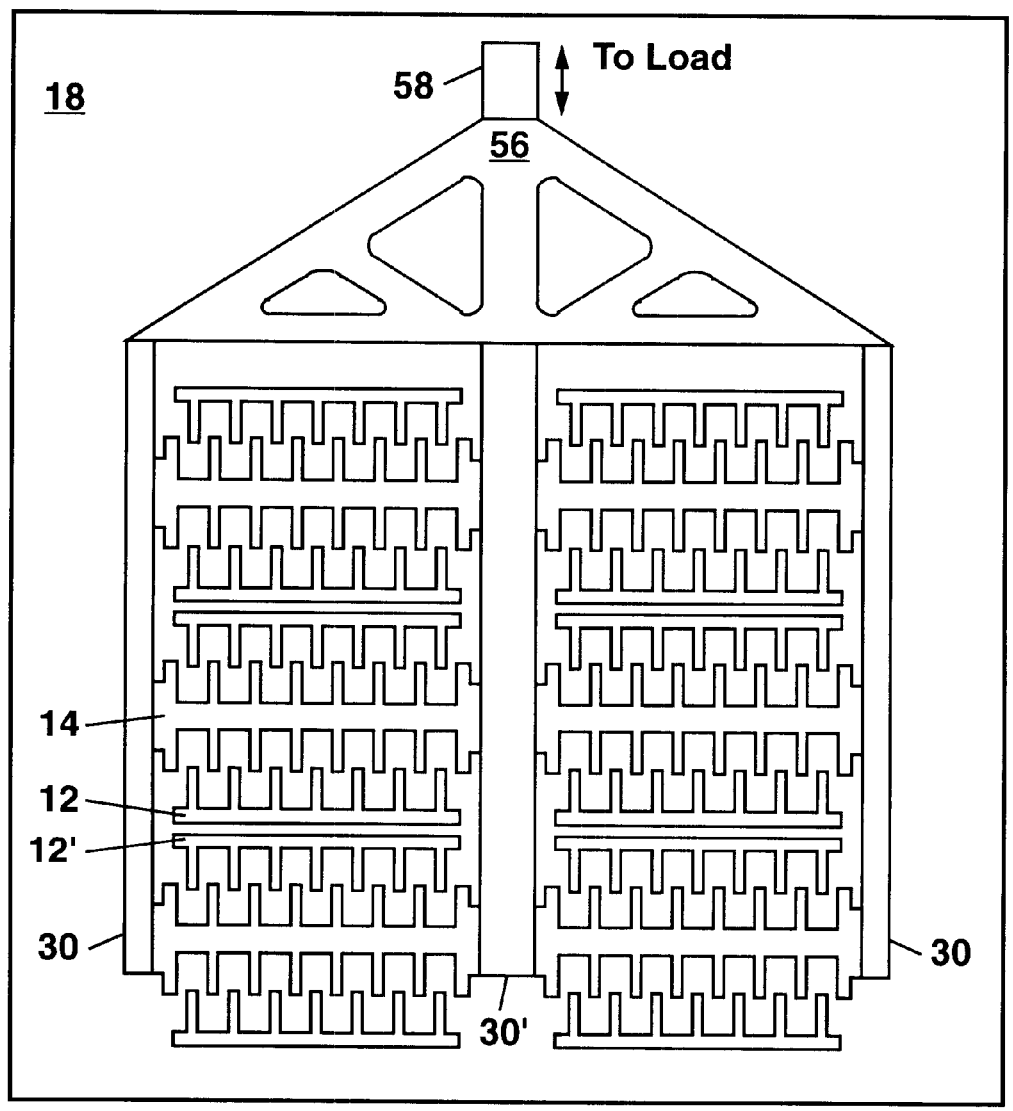
FIG. 7 shows a third embodiment of the electrostatic actuator which operates in a push-pull arrangement to provide an increased actuation stroke.

To further increase an actuation stroke produced by the electrostatic comb actuator, the electrostatic combs 12 and 14 can be arranged in a push-pull type of arrangement as shown for a third embodiment of the present invention in FIG. 7. This third embodiment provides an actuation stroke that is twice that of the device in FIG. 4, but with a reduced drive force in each direction of actuation.

By forming a plurality of double-sided moveable electrostatic combs 14 as shown in FIG. 7, the need for horizontal electrostatic shields can be eliminated since any unwanted electrostatic field in a direction opposing the actuation direction will be substantially reduced. With this arrangement, the actuation voltage, V, can be alternately switched between a plurality of upward-facing stationary electrostatic combs 12 and downward-facing stationary combs 12' to provide a forward and backward motion (indicated by the double-headed arrow in FIG. 7) that can be coupled to a load. One or more restoring springs 16 can be provided within the outline of the electrostatic combs and truss, for example, with spring members of each restoring spring 16 being located below the double-sided moveable electrostatic combs 14. In this way, any electrostatic force generated between a stationary comb 12 or 12' and a restoring spring 16 will be additive to the electrostatic force produced between that stationary comb 12 or 12' and the moveable electrostatic comb 14 overlying the spring 16.

Figure 8:
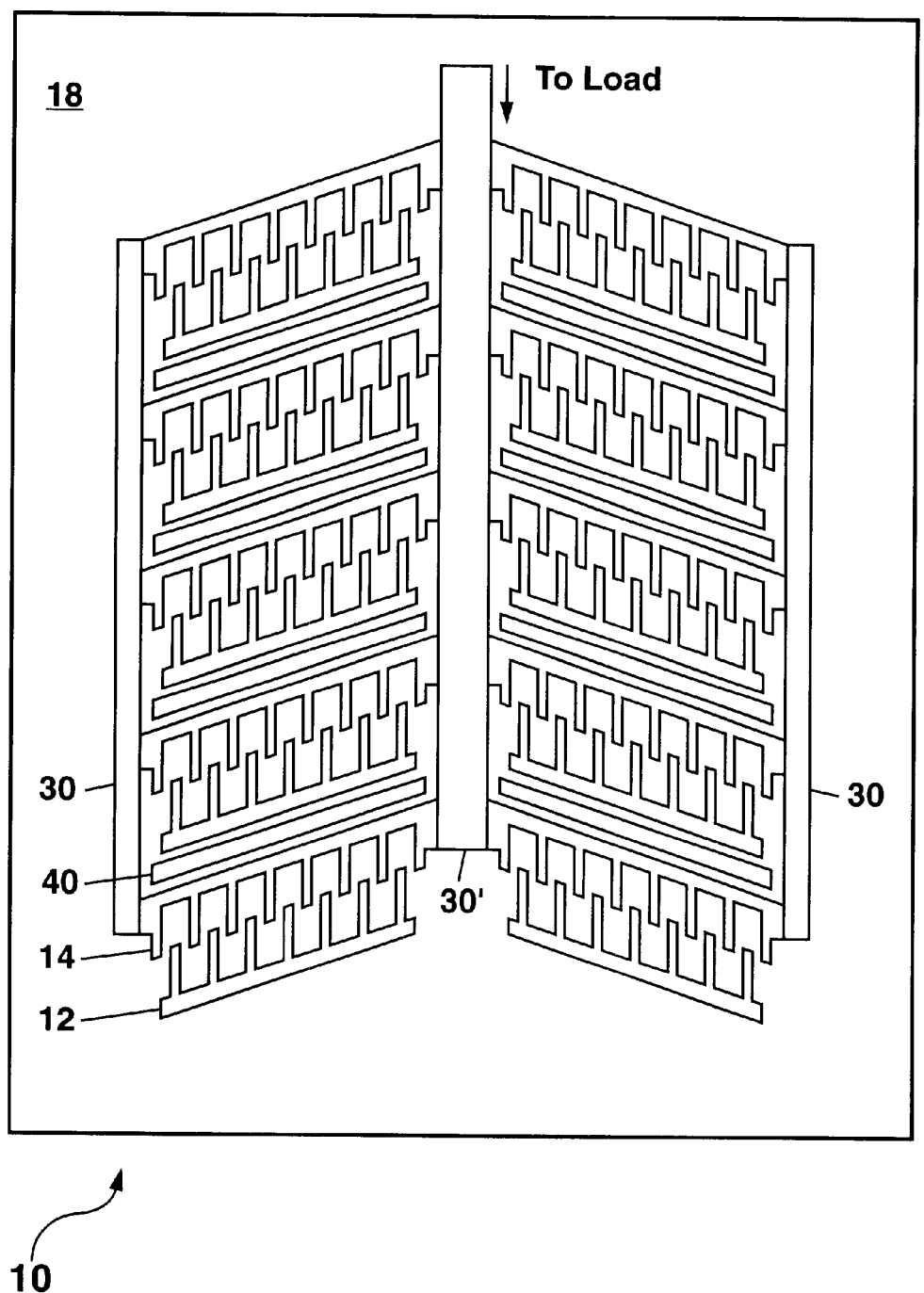
FIG. 8 shows a fourth embodiment of the electrostatic actuator of the present invention with a plurality of electrostatic combs oriented at an angle to the longitudinal beams of the truss.

FIG. 8 shows a fourth embodiment of the electrostatic actuator 10 of the present invention. In the fourth embodiment of the present invention, the moveable electrostatic combs 14 are set at an angle to the longitudinal beams 30 and 30' of the truss 28 so that the generated electrostatic force is concentrated at the central longitudinal beam 30' without the need for a bridge 56. To provide a balanced electrostatic field for each active finger, the ends of each finger can be formed at the substantially same angle as the cross-beams of the electrostatic combs 12 and 14. The arrangement of stationary and moveable combs 12 and 14 in FIG. 8 produces a pulling action (in the direction shown by the arrow) upon actuation. To provide a pushing action, the positions of the stationary electrostatic combs 12 and the moveable electrostatic combs 14 can be switched.

Figure 9:
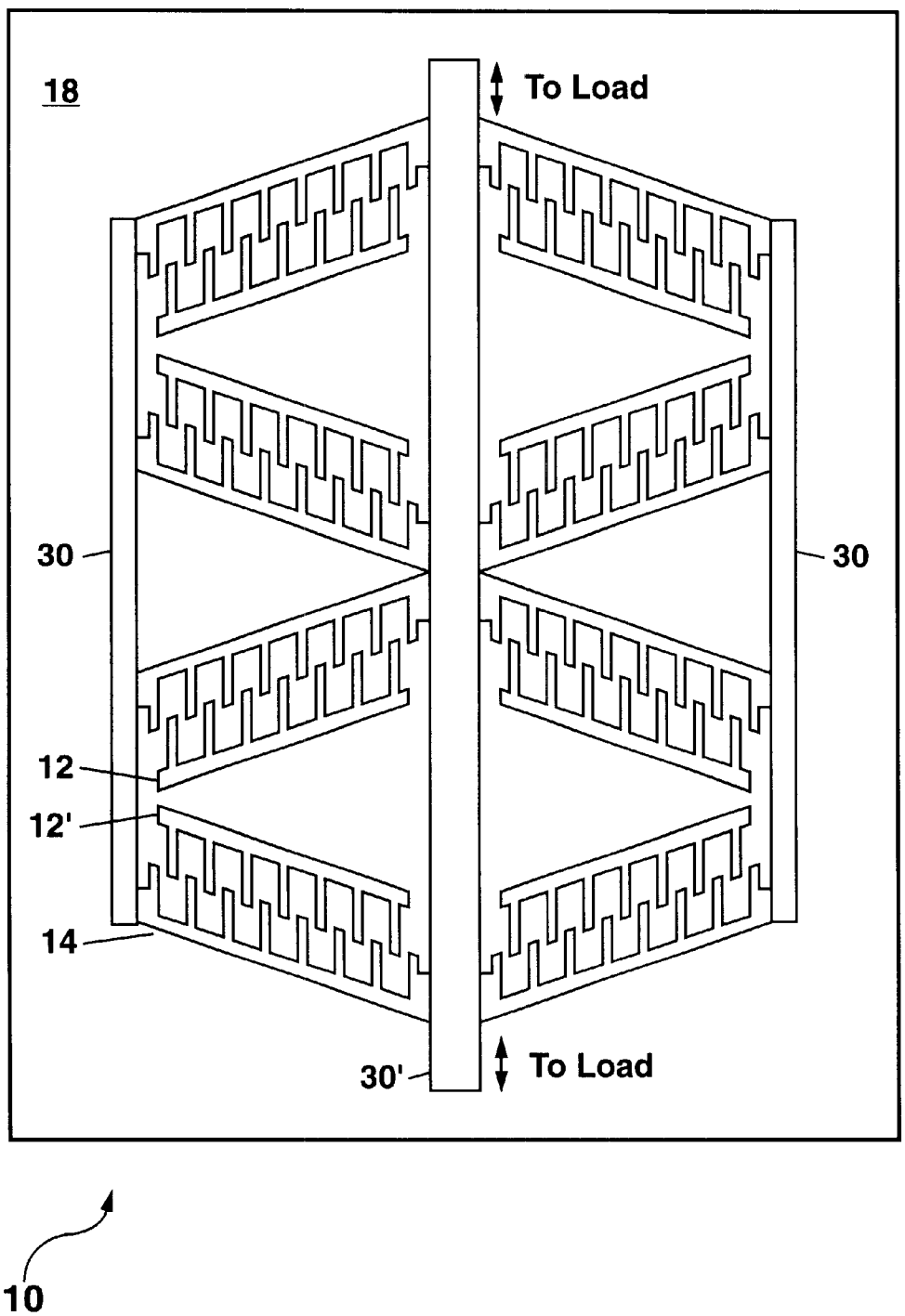
FIG. 9 shows a fifth embodiment of the electrostatic actuator of the present invention, also with a plurality of angled electrostatic combs.

FIG. 9 shows a fifth embodiment of the present invention in the form of a push-pull actuator 10 having a plurality of moveable electrostatic combs 14 set at an angle to the longitudinal beams 30 and 30' of the truss 28. This arrangement of combs 14 can strengthen the truss 28 against any sideways movement due to unbalanced electrostatic fields, and can further obviate the need for a bridge 56 to concentrate the generated electrostatic force at the central longitudinal beam 30' for coupling to a load. The load can be located at either end of the central longitudinal beam 30', or at both ends thereof. The actuator 10 can be moved in one direction of actuation by providing an actuation voltage, V, to the upward-facing stationary combs 12 with the moveable combs 14 maintained at ground electrical potential. The actuator 10 can then be moved in the opposite direction by switching the actuation voltage, V, to the downward-facing stationary combs 12'.

Those skilled in the art will understand based on the teachings of the present invention that different arrangements of the electrostatic combs 12 and 14 are possible for strengthening the shuttle formed by the moveable electrostatic combs 14 and the truss 28, and for concentrating the generated electrostatic force at a particular point for connection to a load.

Other embodiments of the electrostatic actuator 10 of the present invention can be formed without the use of electrostatic combs. These actuators 10 are based on the use of capacitor plates (also termed electrodes hereinafter) which can be, for example, rectangular or square and which do not include any interdigitated fingers as in the electrostatic comb actuators 10 described previously with reference to FIGS. 1–9.

Figure 10:
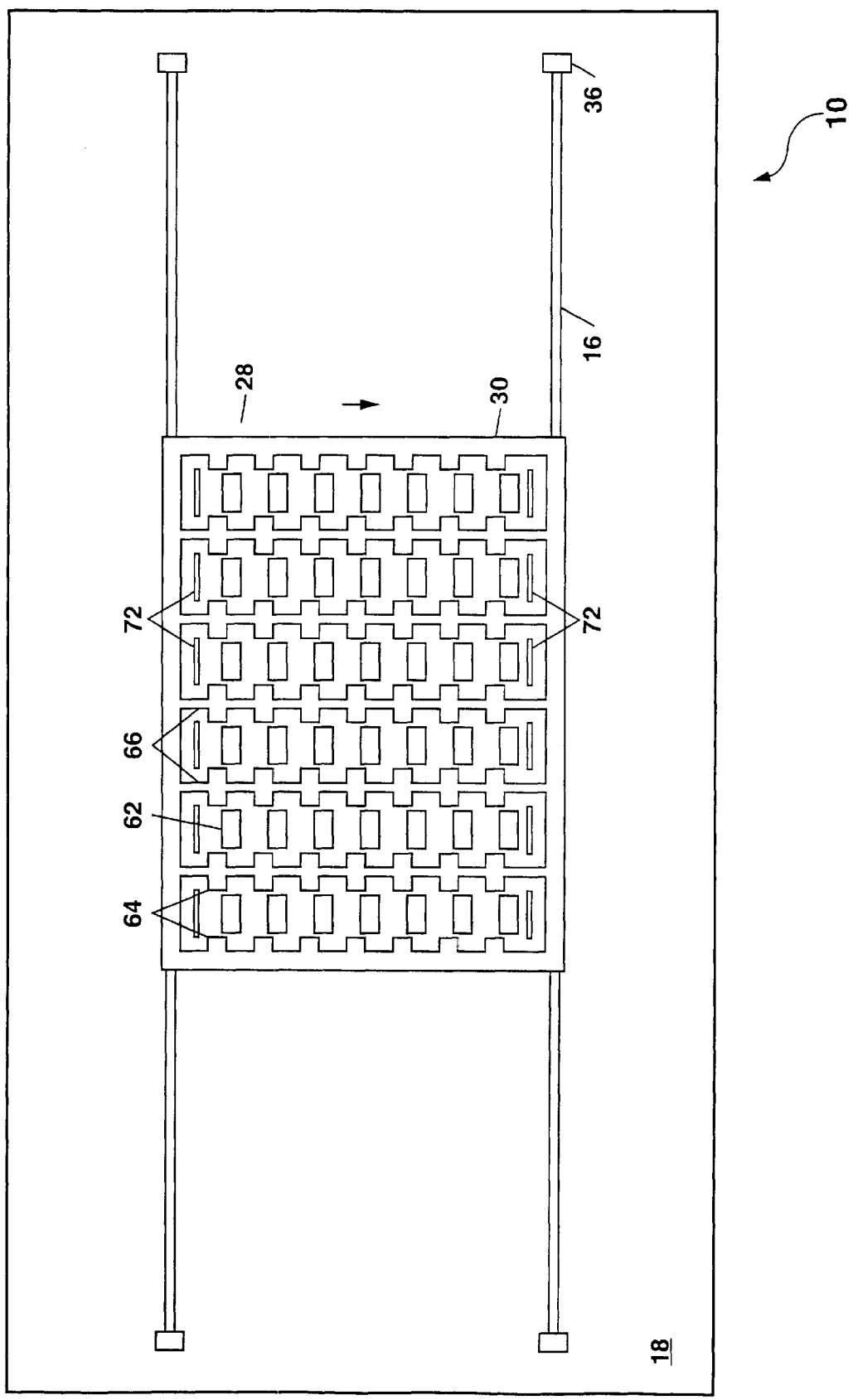
FIG. 10 shows a sixth embodiment of the electrostatic actuator of the present invention.

FIG. 10 shows a sixth embodiment of an electrostatic actuator 10 having a plurality of capacitively-coupled electrodes (i.e. electrostatic plates), including a plurality of rows of rectangular fingerless stationary electrodes 62 formed on a substrate 18, and a row of rectangular moveable electrodes 64 formed on each side of each row of the stationary electrodes 62. By referring to the stationary electrodes 62 as being "fingerless", it is meant that these electrodes do not have interdigitated fingers as in the case of the electrostatic comb actuators of FIGS. 1–9, although other elements of the electrostatic actuator 10 can be formed similarly to the electrostatic comb structures of FIGS. 1–9. In FIG. 10, the moveable electrodes 64 are suspended above the substrate 18 by a frame 28 (i.e. a truss) which supports the majority of the moveable electrodes 64 at or near a midpoint thereof and which surrounds each row of the stationary and moveable electrodes, 62 and 64.

In the example of FIG. 10, each stationary electrode 62 can comprise a plurality of layers of an electrically-conductive material deposited on the substrate 18 and patterned, including at least one structural layer of polysilicon. The various process steps described with reference to FIGS. 3a–3k can be used to fabricate the electrostatic actuators 10 of FIGS. 10–14. When formed on a silicon substrate 18, the stationary electrodes 62 can comprise, for example, two or more stacked and interconnected layers of polysilicon (e.g. the Poly-0 layer for forming an electrical connection to each stationary electrode 62 and one or more of the Poly-1 through Poly-4 layers described previously for forming the structure of each stationary electrode 62). One or more of the polysilicon layers can be doped for electrical conductivity. The lateral dimensions of the stationary electrodes 62 are generally in the range of 2–10 μm, with the exact dimensions depending upon a displacement and force to be provided by the actuator 10. In some instances, the stationary electrodes 62 can have a tapered or curved sidewall on each side adjacent to one of the moveable electrodes 64. In this way, an air gap between the stationary and moveable electrodes, 62 and 64, can be varied during actuation to provide a linear displacement of the moveable electrodes 64 with increasing voltage, V, or to provide a linear electrostatic actuation force from the actuator 10. The absence of any interdigitated fingers on the stationary electrodes 62 allows these electrodes to be formed robust to withstand a high electrostatic field without deformation generated by a large (up to 190 Volts) actuation voltage, V, applied between the stationary and moveable electrodes, 62 and 64.

The moveable electrodes 64 in FIG. 10 have a design similar to that of the stationary electrodes 62, except that the moveable electrodes 64 are suspended above the substrate 18 on a rigid frame 28 that surrounds and supports the moveable electrodes 64. Some of the moveable electrodes 64 can be formed on the longitudinal beams 30 of the frame 28 as shown in the example of FIG. 10; while a majority of the moveable electrodes 64 are located within the frame 28 and connected together in a plurality of rows by links 66. The electrodes 64 formed on the longitudinal beams 30 can be about half the width of the remaining electrodes 64. The majority of the moveable electrodes 64, which are connected by the links 66, can be oriented, for example, with a longitudinal axis thereof being substantially perpendicular to the direction of movement as shown in FIG. 10. The moveable electrodes 64 are preferably maintained at ground electrical potential (e.g. through the frame 28 and springs 16 which are formed from an electrically-conductive material such as doped polysilicon), with the stationary electrodes 62 being operated at an electrical potential sufficiently high for actuation of the device 10.

Figure 11:
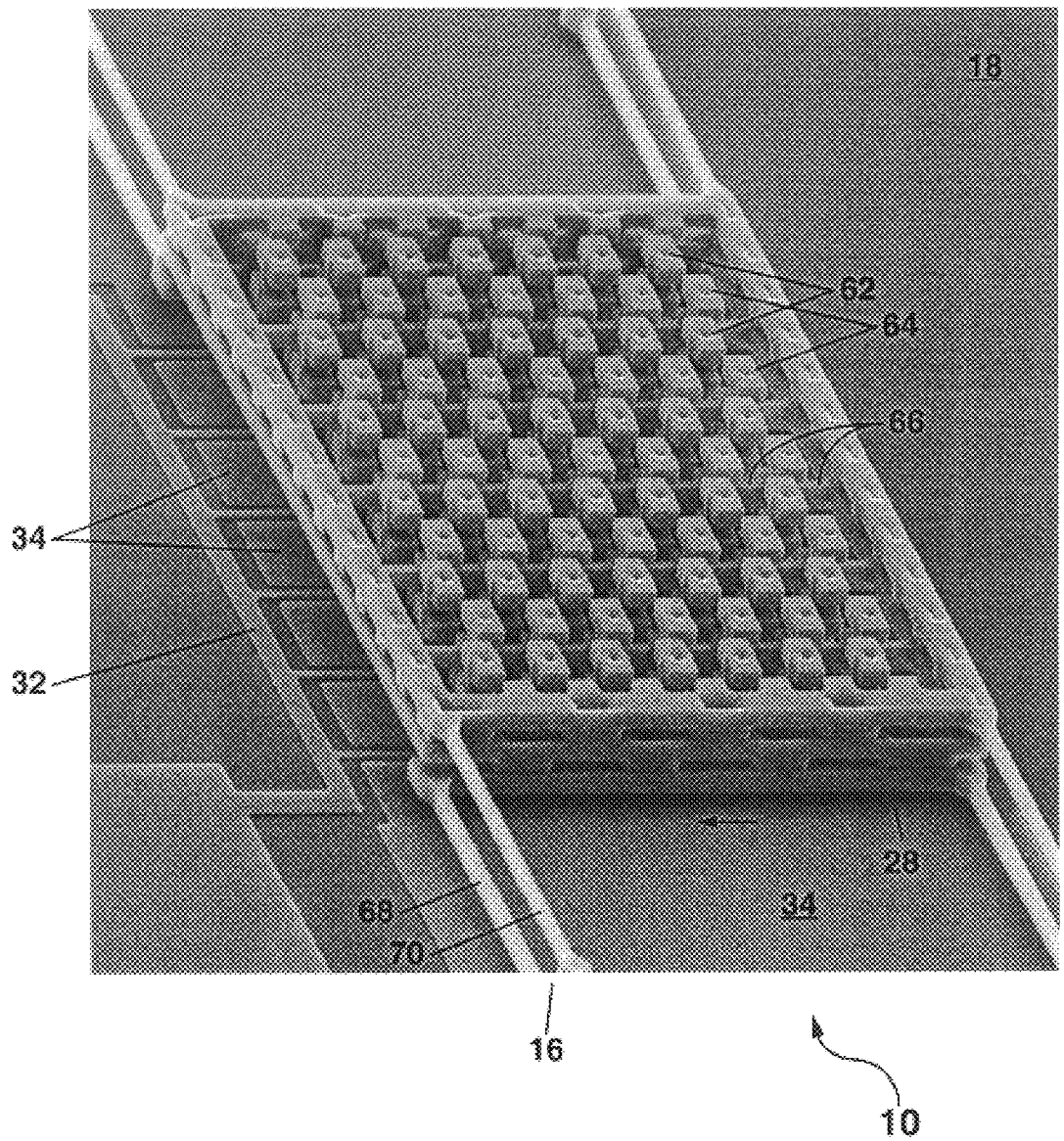
FIG. 11 shows a scanning electron microscope (SEM) image of a portion of an actual fabricated device with the structure of FIG. 10.
Figure 12:
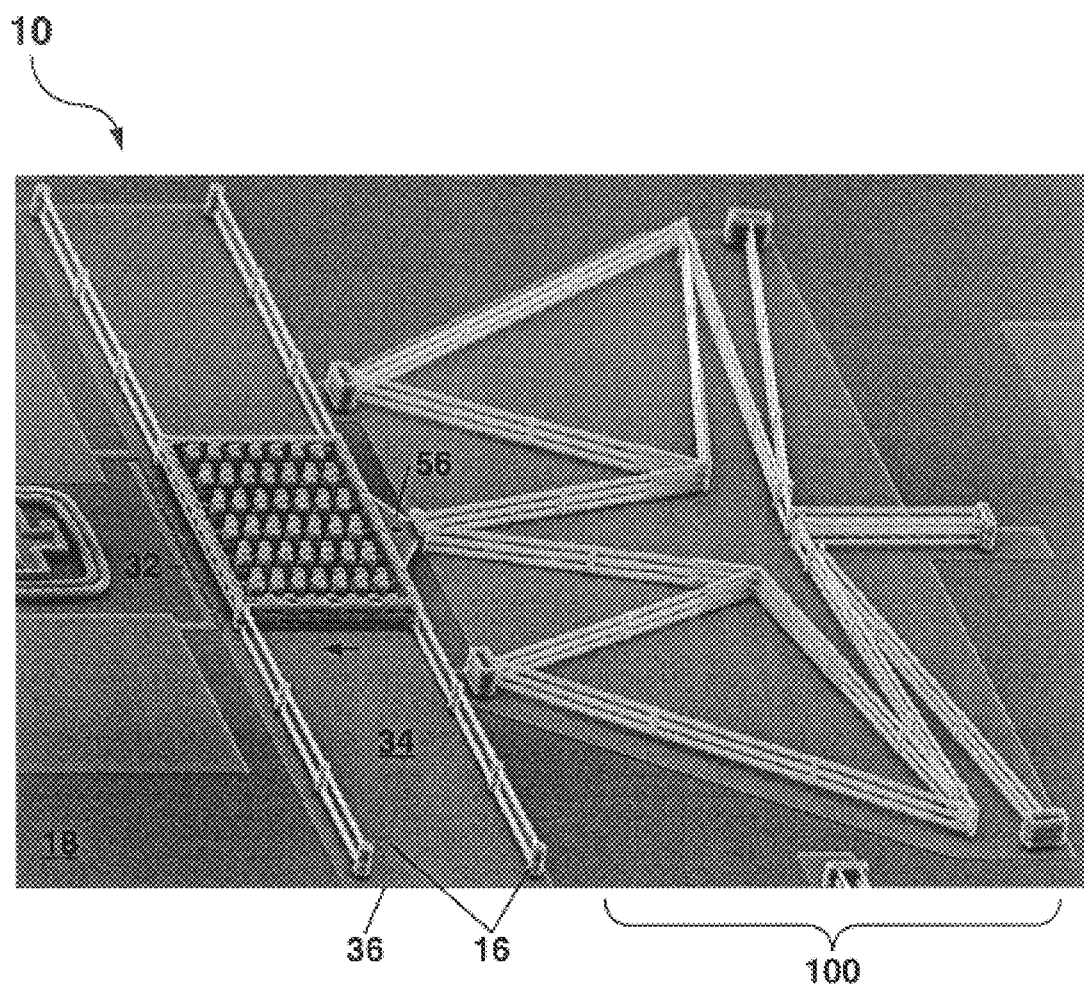
FIG. 12 shows an SEM image of an electrostatic actuator according to FIG. 11 adapted for coupling to a load.
Figure 14:
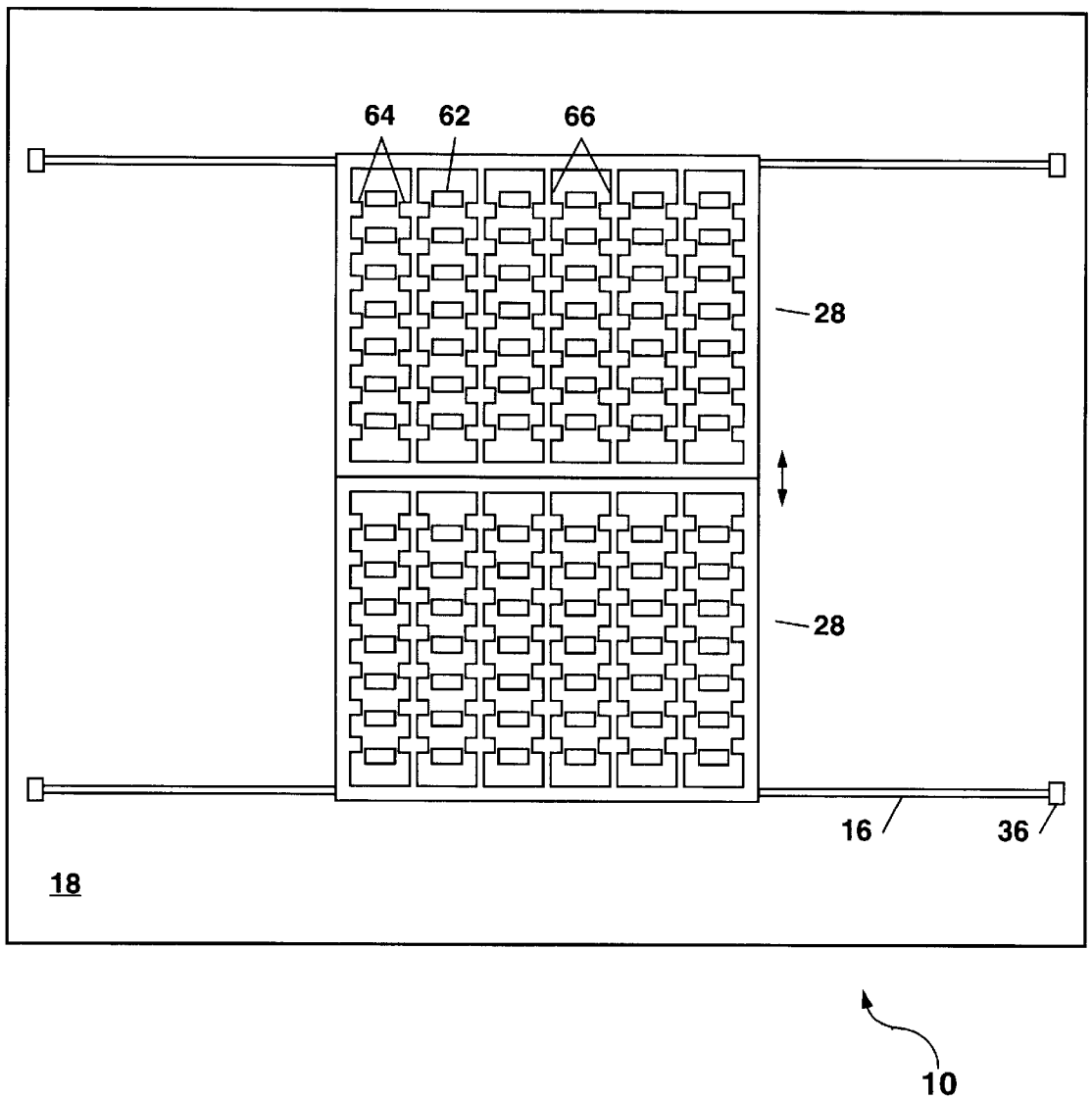
FIG. 14 shows a bidirectional actuator based on the device of FIG. 10.

Ground planes 34 are located beneath the moveable electrodes 64 and the frame 28 and supporting springs 16 as shown in SEM images of an actual devices 10 in FIGS. 11 and 12. These ground planes 34 can be formed from the Poly-0 layer which can also be patterned to form an electrical distribution network 32 for providing an electrical connection to each stationary electrode 62. In some embodiments of the present invention, the stationary electrodes 62 are all electrically connected together for parallel operation; whereas in other embodiments of the present invention, the stationary electrodes 62 can be independently contacted or else contacted to form particular sets of electrodes 62 which can be operated at the same time. An example of such a contacting scheme is a bidirectional actuator 10 which is schematically illustrated in FIG. 14. Here, a pair of electrical distribution networks 32 similar to that of FIG. 11 can be provided, with one network 32 activating a first set of stationary electrodes 62 in a first frame 28 to move the two connected frames 28 and moveable electrodes 64 in one direction, and with the other network 32 activating a second set of stationary electrodes 62 in a second frame 28 to move the two connected frames 28 and moveable electrodes 64 in the other direction.

Digital addressing schemes can also be provided for contacting the stationary electrodes 62. In this case, the stationary electrodes 62 can be partitioned to form different sets of independently-contacted electrodes 62 which contain, for example, n, 2n, 4n, 8n, 16n, 32n, 64n, and 128n electrodes 62, where n is an integer. By addressing these different sets of the stationary electrodes 62 and providing the actuation voltage, V, to particular combinations of the sets of stationary electrodes 62, the electrostatic force and displacement provided by the actuator 10 can be controlled to a predetermined level of precision (e.g. to 8-bit accuracy). The displacement provided by the electrostatic actuator 10 in the case of digital addressing can be in the range of 0–10 µm with sub-micron accuracy. Those skilled in the art will understand that other digital addressing schemes are possible for the electrostatic actuator 10 depending upon a desired bit resolution for the electrostatic force and displacement to be provided by the electrostatic actuator 10.

In the example of FIGS. 10–12, the frame 28 includes a plurality of links 66 for interconnecting and supporting the majority of the moveable electrodes 64. These links 66 can be made with a width and height that is generally smaller (e.g. about one-half or less) than that of the moveable electrodes 64 to reduce the capacitance between the links 66 and the stationary electrodes 62, although in some instances the links 66 can be formed from the same layers used to form the moveable electrodes 64. In FIGS. 11 and 12, the links 66 are made from a single layer of polysilicon (the Poly-3 layer) that is about 2 µm thick. The use of thin vertical and horizontal dimensions for the links 66 can be advantageous since it provides a very large change in capacitance with displacement, $\Delta C/\Delta x$, as the moveable electrodes 64 move toward the stationary electrodes 62 upon application of the actuation voltage, V. This change in capacitance with displacement can be directly related to the electrostatic force that can be generated by the actuator 10.

The links 66 connect together the individual moveable electrodes 64 into a rigid row that is firmly attached at each end to the frame 28. This holds the moveable electrodes 64 in tension to prevent the electrodes 64 from moving sideways and possibly contacting the stationary electrodes 62 when high actuation voltages are used. A balanced structure for the electrostatic actuator 10 is used with moveable electrodes 64 being located on each side of each row of the stationary electrodes 62 to balance the sideways electrostatic forces (i.e. in a direction substantially perpendicular to the direction of motion of the frame 28). This further aids in preventing sideways motion and contact between the stationary and moveable electrodes, 62 and 64. This balanced structure allows very high actuation voltages (up to 190 Volts in one instance) to be applied across a narrow gap (about 1 µm) which separates the stationary and moveable electrodes, 62 and 64. Such high voltages, in turn, allow the generation of a substantial electrostatic force from the actuator 10 since the force generated is proportional to the square of the actuation voltage, V. As an example, the actuators 10 shown in FIGS. 11 and 12, with lateral dimensions of 115 µm×72 µm for the frame 28, can produce an electrostatic drive force that is about one-hundred times larger per unit area than that produced by a conventional electrostatic comb drive.

Each spring 16 in FIGS. 10–12 can be, for example, 100–200 µm long. These springs 16 are used to suspend the frame 28 and moveable electrodes 64 above the substrate 18 while allowing a limited displacement (e.g. generally in the range of 0–10 µm, and in particular up to about 2–3 µm for the device 10 shown in FIGS. 11 and 12) of the frame 28 and moveable electrodes 64 in response to an applied voltage, V.

The exact displacement depends upon a number of factors, including the magnitude of the applied voltage, V, and any backward force produced by a load 100 coupled to the frame 28 that must be overcome in order to move the load (see FIG. 12). A maximum displacement for the electrostatic actuator of FIGS. 10–12 occurs when each moveable electrode 64 is brought into alignment with the adjacent stationary electrode 62. The maximum displacement is self-limiting in that any further increase in the applied voltage, V, will result in little, if any, increase in the displacement. Thus, above a certain voltage, $V_m$, needed to reach the maximum displacement, operation of the electrostatic actuator 10 is relatively insensitive to the exact value of the applied voltage, V. This is in contrast to electrostatic comb actuators in which the displacement increases with voltage until a stop is encountered which limits further displacement, or until the stationary and moveable electrostatic combs come into contact with each other. No stops are required to limit forward motion of the electrostatic actuator 10 of FIGS. 10–12 so that the actuator 10 is generally free from contact (i.e. contact-free). Stops can be optionally provided if needed, for example, to limit backward motion in the absence of any applied voltage, V. Furthermore, at the maximum displacement, the electrostatic force of attraction between the stationary and moveable electrodes, 62 and 64, is at its largest value since the distance between the stationary and moveable electrodes, 62 and 64, is at a minimum. This large electrostatic force produces an electrostatic braking action to limit any further movement of the frame 28 in either direction (e.g. due to an increased or decreased loading of the actuator 10 or any vibration coupled back into the actuator 10 from the load 100) while the voltage, V, is applied to the actuator 10.

Once the applied voltage, V, is removed, the springs 16, which become bowed upon actuation of the device 10 and thereby provide an increased lateral stability for the actuator 10, act to restore the frame 28 and moveable electrodes 64 to their initial rest position. A cyclic motion of the electrostatic actuator 10 can be generated by using a cyclic applied voltage, V.

The SEM images of FIGS. 11 and 12 show that the springs 16 can be formed from a pair of stacked and interconnected linear spring members to provide compliance in an actuation direction (i.e. the direction of movement indicated by the arrow in FIGS. 10 and 11) while also providing a relatively high stiffness in the vertical direction (i.e. normal to the substrate 18) to limit out-of-plane movement which could otherwise possibly result in stiction. To achieve these results, the springs 16 can be formed, for example, by using the Poly 1 and 2 layers deposited one upon the other to form a lower spring member 68, and by using the Poly 4 layer to form an upper spring member 70. The Poly 3 layer can then be used to periodically tie the lower and upper spring members, 68 and 70, together and thereby provide a spring structure having an increased stiffness in the vertical direction, while at the same time being compliant in the direction of motion of the actuator 10. Those skilled in the art will understand that other arrangements for the springs 16 are possible, including the use of folded springs or springs underlying or overlying the frame 28. The exact structure for the springs 16 will depend upon the space allotted for the electrostatic actuator 10 and whether or not a plurality of electrostatic actuators 10 are to be connected together to provide an increased actuation force, or to form a bidirectional actuator 10.

In FIG. 10, optional electrostatic shields 72 are shown between the frame 28 and the stationary electrodes 62. These electrostatic shields 72, which can be built up from the substrate 18 (e.g. using the Poly-1 through Poly-4 layers) and maintained at ground electrical potential, serve to limit an electrostatic force of attraction between the stationary electrodes 62 and the frame 28. Such an electrostatic force between the stationary electrodes 62 and the frame 28 is undesirable since it can be oppositely directed to the electrostatic force generated between the stationary and moveable electrodes, 62 and 64.

In FIG. 12, an electrostatic actuator 10 similar to that of FIGS. 10 and 11 is shown driving a load in the form of a compliant mechanism 100. The compliant mechanism 100 serves to multiply the displacement generated by the electrostatic actuator 10 for actuation of additional loads (e.g. moveable members within a MEM device) which require a displacement larger than that which can be produced by the actuator 10. In FIG. 12, an input side of the compliant mechanism 100 is shown connected to the electrostatic actuator 10 via a bridge 56 which concentrates the force generated by the actuator 10 at a single location.

Figure 13:
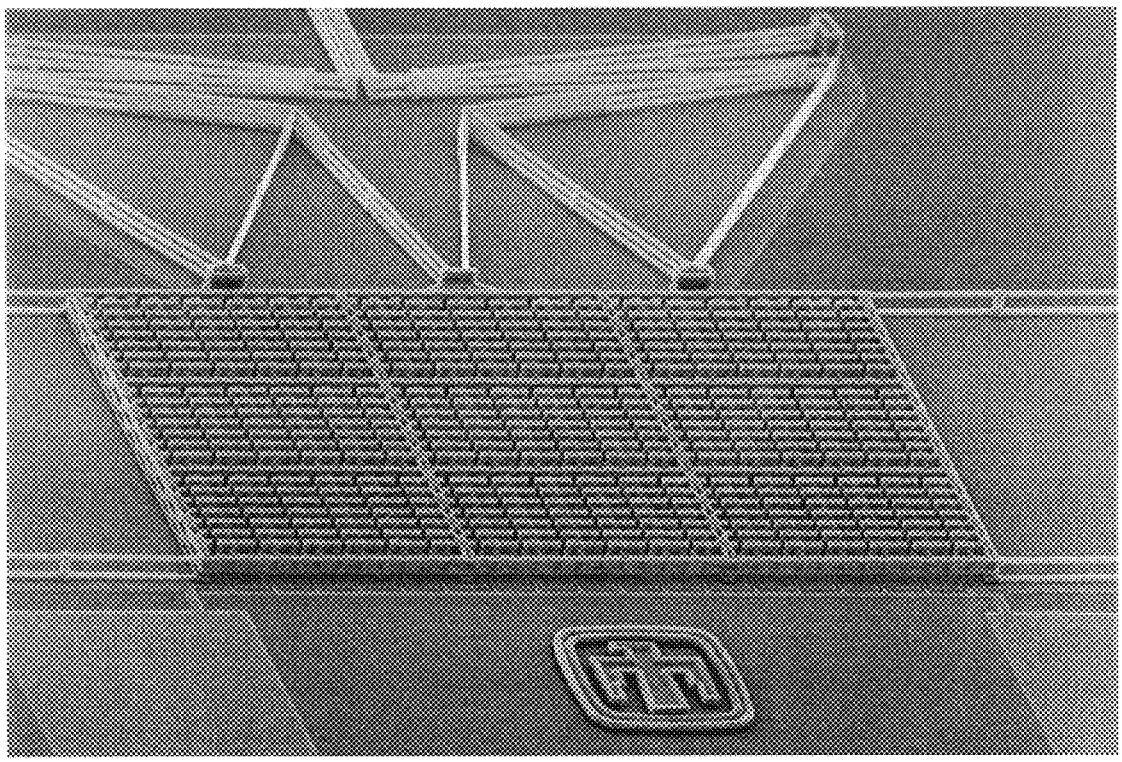
FIG. 13 shows an SEM image of another electrostatic actuator similar to that of FIG. 12, but with nine times the number of stationary and moveable electrodes.

An advantage of the electrostatic actuator 10 of FIG. 10 is that it can easily be scaled up to larger sizes to provide an increased actuation force, or to reduce the actuation voltage, V, required to drive a load. An example of such scaling is shown in FIG. 13 where an electrostatic actuator 10 has been fabricated with nine times the number of stationary and moveable electrodes, 62 and 64, shown in the device 10 of FIG. 11. The springs 16 used in the electrostatic actuator 10 of FIG. 13 can be about the same size as the springs 16 in the actuator 10 of FIG. 11.

The electrostatic actuator 10 of FIG. 10 can also be formed as a bidirectional actuator. This can be done, for example, as shown in FIG. 14 where a pair of frames 28 are connected together with the stationary and moveable electrodes, 62 and 64, in each frame 28 being oppositely directed. By independently contacting the stationary electrodes 62 within each frame 28, the applied voltage, V, can be applied between the stationary and moveable electrodes, 62 and 64, of one frame 28 to provide a displacement in one direction, and between the electrodes, 62 and 64, of the other frame 28 to provide a displacement in the opposite direction.

The matter set forth in the foregoing description and accompanying drawings is offered by way of illustration only and not as a limitation. Other applications and variations of the electrostatic actuator of the present invention will become evident to those skilled in the art. For example, although the electrostatic combs and electrodes have been described herein as being formed from doped polysilicon, other electrically-conductive materials including metals or metal alloys can be used to form the electrostatic combs and electrodes. Additionally, the fingers of the electrostatic combs can be coated with a thin layer (e.g. 50–200 nanometers) of deposited silicon nitride to provide electrical insulation to further reduce any possibility of short-circuiting of the closely-spaced fingers. Finally, the electrostatic actuator has a high capacitance so that it can also be used for sensing applications (e.g. to form an accelerometer which capacitively senses motion produced by a force of acceleration or deceleration). The actual scope of the invention is intended to be defined in the following claims when viewed in their proper perspective based on the prior art.

What is claimed is:

1. An electrostatic actuator formed on a substrate and comprising a plurality of capacitively-coupled electrostatic plates including at least one row of fingerless stationary electrostatic plates formed on the substrate and oriented along a direction of movement of the electrostatic actuator; and a row of moveable electrostatic plates formed on at least one side of each row of the stationary electrostatic plates, with the moveable electrostatic plates being suspended above the substrate by a rigid frame which supports a majority of the moveable electrostatic plates at or near a midpoint thereof, the frame further surrounding and enclosing each row of the stationary electrostatic plates.

2. The electrostatic actuator of claim 1 wherein the frame is suspended above the substrate by a plurality of springs, with each spring being attached at one end thereof to the frame and attached at the other end thereof to the substrate.

3. The electrostatic actuator of claim 1 wherein the frame is moveable over a range of 0–10 microns in response to a voltage applied between the stationary electrostatic plates and the moveable electrostatic plates.

4. The electrostatic actuator of claim 3 wherein the voltage is simultaneously applied between all the stationary electrostatic plates and all the moveable electrostatic plates.

5. The electrostatic actuator of claim 3 wherein the stationary electrodes are digitally addressed to provide the voltage between at least one set of the stationary electrostatic plates and the moveable electrostatic plates.

6. The electrostatic actuator of claim 1 wherein a longitudinal axis of the moveable electrostatic plates is oriented substantially perpendicular to the direction of movement.

7. The electrostatic actuator of claim 1 wherein a spacing between adjacent moveable electrostatic plates in each row of the moveable electrostatic plates is substantially equal to the spacing between adjacent stationary electrostatic plates in each row of the stationary electrostatic plates.

8. The electrostatic actuator of claim 1 wherein a spacing between each moveable electrostatic plate and an adjacent stationary electrostatic plate is substantially the same for all of the stationary and moveable electrostatic plates.

9. The electrostatic actuator of claim 1 wherein the frame comprises a plurality of layers of a deposited and patterned electrically-conductive material.

10. The electrostatic actuator of claim 9 wherein the electrically-conductive material comprises polycrystalline silicon.

11. The electrostatic actuator of claim 10 wherein the substrate comprises silicon.

12. The electrostatic actuator of claim 9 wherein the frame further includes a plurality of links for supporting the majority of the moveable electrostatic plates at the midpoint thereof.

13. The electrostatic actuator of claim 1 further including a ground plane on the substrate below each row of the moveable electrostatic plates.

14. The electrostatic actuator of claim 1 further including an electrostatic shield on the substrate between the frame and an adjacent stationary electrostatic plate.

15. An electrostatic actuator formed on a substrate and comprising:
   (a) a plurality of moveable electrodes suspended above the substrate and arranged in at least one row oriented along a direction of movement of the electrostatic actuator;
   (b) a rigid frame surrounding and supporting the moveable electrodes; and
   (c) a plurality of fingerless stationary electrodes formed on the substrate in a row proximate to the row of moveable electrodes, the rows of stationary and moveable electrodes acting in response to a voltage applied therebetween to urge the frame to move along the direction of movement.

16. The electrostatic actuator of claim 15 wherein the frame is suspended above the substrate by a plurality of springs, with each spring being attached at one end thereof to the frame and attached at the other end thereof to the substrate.

17. The electrostatic actuator of claim 15 wherein all the stationary electrodes are electrically connected together, and all the moveable electrodes are electrically connected together.

18. The electrostatic actuator of claim 15 wherein the stationary electrodes are configured as sets of electrodes to provide for digital addressing of at least one set of the stationary electrodes with the applied voltage.

19. The electrostatic actuator of claim 15 wherein the stationary electrodes are independently addressable.

20. The electrostatic actuator of claim 15 wherein a spacing between each moveable electrode and a nearest stationary electrode is substantially equal for all of the stationary and moveable electrodes.

21. The electrostatic actuator of claim 15 wherein the frame comprises a plurality of layers of a deposited and patterned electrically-conductive material.

22. The electrostatic actuator of claim 21 wherein the electrically-conductive material comprises polycrystalline silicon, and the substrate comprises silicon.

23. The electrostatic actuator of claim 21 wherein the frame further includes a plurality of links for supporting a majority of the moveable electrodes at or near a midpoint thereof.

24. The electrostatic actuator of claim 15 further including a ground plane formed on the substrate below each row of the moveable electrodes.

25. The electrostatic actuator of claim 15 further including an electrostatic shield formed on the substrate between the frame and an adjacent stationary electrode.

26. An electrostatic actuator formed on a substrate and comprising:
   (a) a plurality of stationary electrodes formed on the substrate and regularly spaced in at least one row oriented along a direction of movement of the electrostatic actuator;
   (b) a rigid frame supported above the substrate by a plurality of springs, with the frame surrounding each row of the stationary electrodes; and
   (c) a plurality of moveable electrodes located on the frame on both sides of each row of the stationary electrodes, the moveable electrodes acting in combination with the stationary electrodes to displace the frame in the direction of movement in response to an applied voltage.

27. The electrostatic actuator of claim 26 wherein the moveable electrodes are supported on the frame by a plurality of links connecting the moveable electrodes and forming a plurality of rows of the moveable electrodes.

28. The electrostatic actuator of claim 27 wherein each link has a thickness that is smaller than the thickness of the moveable electrodes.

29. The electrostatic actuator of claim 28 wherein the thickness of each link is less than one-half the thickness of the moveable electrodes.

30. The electrostatic actuator of claim 26 wherein the frame comprises polycrystalline silicon, and the substrate comprises silicon.

31. The electrostatic actuator of claim 26 further including a ground plane formed on the substrate below the moveable electrodes.

32. The electrostatic actuator of claim 26 further including an electrostatic shield formed on the substrate between the frame and an adjacent stationary electrode.

33. The electrostatic actuator of claim 26 wherein the stationary electrodes are configured as sets of electrodes to provide for digital addressing of at least one set of the stationary electrodes with the applied voltage.

34. An electrostatic actuator, comprising:
   (a) a substrate;
   (b) a plurality of fingerless stationary electrodes formed on the substrate and arranged in at least one row oriented along a direction of movement of the electrostatic actuator;
   (c) a plurality of moveable electrodes suspended above the substrate, with the number of moveable electrodes being at least equal to the number of stationary electrodes, and with at least one of the moveable electrodes acting in combination with each stationary electrode to generate an electrostatic force in response to a voltage applied therebetween to urge the moveable electrodes to move in the direction of movement; and
   (d) a rigid frame surrounding and supporting the moveable electrodes above the substrate, with the frame being attached to the substrate by a plurality of springs.

35. The electrostatic actuator of claim 34 wherein the frame, the stationary electrodes and the moveable electrodes comprise a plurality of layers of a deposited and patterned electrically-conductive material.

36. The electrostatic actuator of claim 35 wherein the electrically-conductive material comprises polycrystalline silicon.

37. The electrostatic actuator of claim 36 wherein the substrate comprises silicon.

38. The electrostatic actuator of claim 35 wherein the frame further comprises a plurality of links for supporting a majority of the moveable electrodes, with each link being formed from at least one layer of the electrically-conductive material.

39. The electrostatic actuator of claim 34 further including a ground plane formed on the substrate below the moveable electrodes.

40. The electrostatic actuator of claim 34 further including an electrostatic shield formed on the substrate between the frame and an adjacent stationary electrode.

41. The electrostatic actuator of claim 34 wherein the stationary electrodes are configured as sets of electrodes to provide for digital addressing of at least one set of the stationary electrodes with the applied voltage.

42. An electrostatic actuator formed on a substrate and comprising:
   (a) a plurality of fingerless stationary electrodes formed on the substrate from a plurality of layers of deposited and patterned electrically-conductive material;
   (b) a plurality of moveable electrodes suspended above the substrate proximate to the stationary electrodes, with the moveable electrodes being formed from at least one layer of the plurality of layers of deposited and patterned electrically-conductive material;
   (c) a plurality of links connecting the moveable electrodes, with the links being formed from at least one layer of the plurality of layers of the deposited and patterned electrically-conductive material; and
   (d) a rigid frame surrounding and supporting the links and moveable electrodes, with the frame being formed from at least one layer of the plurality of layers of deposited and patterned electrically-conductive material and further being moveable in response to a voltage applied between the stationary and moveable electrodes.

43. The electrostatic actuator of claim 42 wherein the electrically-conductive material comprises polycrystalline silicon.

44. The electrostatic actuator of claim 43 wherein the substrate comprises silicon.

45. The electrostatic actuator of claim 43 wherein the links comprise at least one layer of polycrystalline silicon.

46. The electrostatic actuator of claim 42 wherein the voltage is simultaneously applied between all the stationary electrodes and all the moveable electrodes.

47. The electrostatic actuator of claim 42 wherein the stationary electrodes are configured as sets of electrodes to provide for digital addressing of at least one set of the stationary electrodes with the applied voltage.

* * * * *